United States Patent
Chen et al.

(10) Patent No.: US 9,130,643 B2
(45) Date of Patent: *Sep. 8, 2015

(54) SYSTEMS AND METHODS FOR ENHANCING AUDIO QUALITY OF FM RECEIVERS

(75) Inventors: Juin-Hwey Chen, Irvine, CA (US); Thomas F. Baker, Dana Point, CA (US); Evan S. McCarthy, Irvine, CA (US); Jes Thyssen, San Juan Capistrano, CA (US); Walter J. Wihardja, Tustin, CA (US); David C. Garrett, Tustin, CA (US)

(73) Assignee: Broadcom Corporation, Irvine, CA (US)

( * ) Notice: Subject to any disclaimer, the term of this patent is extended or adjusted under 35 U.S.C. 154(b) by 667 days.

This patent is subject to a terminal disclaimer.

(21) Appl. No.: 13/362,244

(22) Filed: Jan. 31, 2012

(65) Prior Publication Data

US 2013/0195163 A1  Aug. 1, 2013

(51) Int. Cl.
*H04B 1/10* (2006.01)
*H03D 1/04* (2006.01)
(Continued)

(52) U.S. Cl.
CPC .............. *H04B 1/1661* (2013.01); *H03G 3/345* (2013.01); *H04B 1/04* (2013.01); *H04B 1/7183* (2013.01)

(58) Field of Classification Search
CPC ...... H04B 1/1661; H04B 1/7183; H04B 1/04; H03G 3/345
USPC ............. 381/13, 57, 94.1; 375/232, 350, 341, 375/254, 262, 354, 347, 227, 346; 370/252; 455/272, 502, 214, 110, 296; 360/65; 342/357.66; 704/228; 700/94; 702/103; 329/372
See application file for complete search history.

(56) References Cited

U.S. PATENT DOCUMENTS 5,423,001 A * 6/1995 Ueda .............................. 329/372
5,822,701 A * 10/1998 Tomisato et al. ............. 455/502
(Continued)

FOREIGN PATENT DOCUMENTS

CN  101071568 A  11/2007
CN  101099324 A  1/2008
(Continued)

OTHER PUBLICATIONS

Ismo Kauppinen and Kari Roth, Audio Signal Extrapolation—Therory and Applications, Sep. 26, 2002.*
(Continued)

*Primary Examiner* — Vivian Chin
*Assistant Examiner* — Ubachukwu Odunukwe
(74) *Attorney, Agent, or Firm* — Fiala & Weaver P.L.L.C.

(57) ABSTRACT

Systems and methods are described for enhancing the audio quality of an FM receiver. In embodiments described herein, quadrature L–R demodulation is applied to a composite baseband signal output by an FM demodulator to obtain an L–R noise signal. A channel quality measure is calculated based on the L–R noise signal and is used to control whether a pop suppression technique is applied to an L+R signal obtained from the composite baseband signal to detect and remove noise pulses therefrom. The channel quality measure and the L–R noise signal are also leveraged to perform single-channel noise suppression in the frequency domain on an L–R signal obtained from the composite baseband signal and on the L+R signal. The channel quality measure is also used to control the application of a fast fading compensation process that replaces noisy segments of the L–R and L+R signal with replacement waveforms generated via waveform extrapolation.

33 Claims, 24 Drawing Sheets

(51) Int. Cl.
*H04B 1/16* (2006.01)
*H04B 1/7183* (2011.01)
*H03G 3/34* (2006.01)
*H04B 1/04* (2006.01)

(56) References Cited

U.S. PATENT DOCUMENTS

| | | | |
|---|---|---|---|
| 6,356,101 B1 | 3/2002 | Erstad | |
| 6,470,047 B1* | 10/2002 | Kleinerman et al. | 375/232 |
| 7,190,727 B1* | 3/2007 | Liang | 375/254 |
| 8,280,728 B2 | 10/2012 | Chen et al. | |
| 8,325,939 B1* | 12/2012 | King et al. | 381/94.1 |
| 8,417,206 B2 | 4/2013 | Allen et al. | |
| 8,520,779 B2 | 8/2013 | Ban | |
| 2001/0044289 A1* | 11/2001 | Tsuji et al. | 455/296 |
| 2003/0135365 A1* | 7/2003 | Thyssen et al. | 704/228 |
| 2004/0190659 A1* | 9/2004 | Raj et al. | 375/350 |
| 2006/0203943 A1* | 9/2006 | Scheim et al. | 375/341 |
| 2007/0118369 A1 | 5/2007 | Chen | |
| 2007/0297622 A1* | 12/2007 | Saito et al. | 381/94.1 |
| 2008/0014890 A1* | 1/2008 | Hardacker et al. | 455/249.1 |
| 2008/0019538 A1* | 1/2008 | Kushner et al. | 381/94.1 |
| 2008/0252517 A1* | 10/2008 | Fuchs et al. | 342/357.1 |
| 2009/0006084 A1 | 1/2009 | Chen | |
| 2009/0016459 A1* | 1/2009 | Kim et al. | 375/262 |
| 2009/0110128 A1* | 4/2009 | Yu et al. | 375/354 |
| 2009/0161245 A1* | 6/2009 | Mathew et al. | 360/65 |
| 2009/0225913 A1* | 9/2009 | Nakahara et al. | 375/347 |
| 2010/0067621 A1* | 3/2010 | Noeldner et al. | 375/341 |
| 2010/0067628 A1* | 3/2010 | Buehner et al. | 375/346 |
| 2010/0197264 A1* | 8/2010 | Azadet et al. | 455/272 |
| 2011/0096942 A1 | 4/2011 | Thyssen | |
| 2011/0164669 A1* | 7/2011 | Mathew et al. | 375/227 |
| 2011/0194699 A1* | 8/2011 | Baker et al. | 381/3 |
| 2011/0250859 A1* | 10/2011 | Gu | 455/214 |
| 2012/0033764 A1* | 2/2012 | Ban | 375/340 |
| 2012/0057711 A1* | 3/2012 | Makino et al. | 381/57 |
| 2013/0336144 A1* | 12/2013 | Azadet et al. | 370/252 |

FOREIGN PATENT DOCUMENTS

| | | |
|---|---|---|
| CN | 102237882 A | 11/2011 |
| TW | 584987 B | 4/2004 |
| TW | 200907931 A | 2/2009 |
| TW | 201208264 A | 2/2012 |
| WO | 2011/029570 A1 | 3/2011 |

OTHER PUBLICATIONS

Krishna Balachandran, Channel Quality Estimation and Rate Adaption for Cellular Mobile Radio, Jul. 1999, vol. 17.*

Kim Olszewski, Channel Quality Measurement Method for 802.16ab PHY Layers, Oct. 19, 2001.*

Saeed V. Vaseghi, Advanced Digital Signal Processing and Noise Reduction, 2000, John Wiley & Sons Ltd, Second Edition, Chapter 13—Transient Noise Pulses.*

Tzay Y. Young, Epoch Detection—A method for Resolving Overlapping Signals, Oct. 20, 1964.*

Turin, George L. "An Introduction to matched filters" IRE Transactions on information Theory 6, Jun. 3, 1960, 311-329.*

Office Action Received for Chinese Patent Application No. 201310040868.X, mailed on Jul. 23, 2014, 7 pages (Official copy only).

Office Action Received for Taiwanese Patent Application No. 102103467, mailed on Aug. 15, 2014, 6 pages (Official copy only).

Office Action received for Korean Patent Application No. 10-2013-0011508, mailed on Aug. 13, 2014, 4 pages (Official copy only).

Office Action received for Korean Patent Application No. 10-2013-0011509, mailed on Aug. 13, 2014, 4 pages (Official copy only).

Office Action received for Chinese Patent Application No. 201310039471.9, mailed on Sep. 3, 2014, 6 pages (Official copy only).

Office Action Received for Taiwanese Patent Application No. 102103469, mailed on Aug. 11, 2014, 8 pages (Official copy only).

Office Action received for Chinese Patent Application No. 201310039471.9, mailed on Apr. 30, 2015, 4 pages.

* cited by examiner

SYSTEMS AND METHODS FOR ENHANCING AUDIO QUALITY OF FM RECEIVERS

FIELD OF TECHNOLOGY

The present invention generally relates to receivers used in frequency modulation (FM) broadcasting systems. More particularly, the present invention relates to systems and methods for improving the audio quality of receivers used in FM broadcasting systems.

BACKGROUND

In FM broadcasting systems, the Left (L) and Right (R) channels of a stereo audio signal are transmitted as an L+R signal, which carries the "mono" information, and an L−R signal, which carries the "stereo" information. FIG. 1 depicts a typical spectrum of a composite baseband signal used in an FM broadcasting systems. This composite baseband signal is also sometimes referred to as the FM stereo multiplex (MPX) signal. As reflected in FIG. 1, the L+R signal is transmitted as baseband audio in the range of 30 Hz to 15 kHz while the L−R signal is modulated onto a 38 kHz double-sideband suppressed carrier (DSBSC) signal occupying the baseband range of 23 to 53 kHz. As also reflected in FIG. 1, a 19 kHz pilot tone, at half the 38 kHz sub-carrier frequency and with a precise phase relationship to it is also generated. This is transmitted at 8-10% of the overall modulation level and used by a stereo FM receiver to regenerate the 38 kHz sub-carrier with the correct phase. In addition, a 57 kHz sub-carrier (phase locked to the third harmonic of the stereo pilot tone) may be used to carry a low-bandwidth digital Radio Broadcast Data System (RBDS) signal. The composite baseband signal may further include a DirectBand signal as shown in FIG. 1, as well as other signals that are not shown in FIG. 1. The composite baseband signal is used to modulate the FM transmitter.

A stereo FM receiver will add the L+R signal to the L−R signal to recover the L signal and will subtract the L−R signal from the L+R signal to recover the R signal. It has been observed that the L−R signal has a signal-to-noise ratio (SNR) that is about 20 dB worse than the L+R signal. Thus, as the carrier-to-noise ratio (CNR) decreases, the higher noise level in the L−R signal dominates the perceived noise in the reconstructed L and R signals. To address this issue, in conventional FM receiver designs, the proportion of the L−R contribution used in reconstructing the L and R signals (or the "weight" placed on the L−R signal when calculating a weighted sum of the L+R and L−R signals) is gradually reduced with decreasing CNR so as to reduce the noise level in the reconstructed L and R signals. This is called "stereo blending," and it achieves a reduced noise level at the price of reduced stereo separation. As the CNR continues to decrease, eventually the FM receiver output effectively collapses to only the L+R, or mono, signal. When the CNR crosses below 12 dB or so, an impulsive type of noise appears in the L+R signal and is perceived as "static." Hence, as the CNR decreases to a relatively low level, the reduced stereo separation, the increased hissing background noise, and the appearance of noise pulses (static) all degrade the perceived audio quality of the FM receiver output signal significantly. Any attempt to address these problems should not involve changing the FM transmitters due to the large installed base of FM receivers in use today.

What is needed, then, is a system or method that can operate in an FM receiver and that can improve the audio quality at low CNRs by enhancing the stereo separation and reducing the hissing background noise and static in the FM receiver output audio signal.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
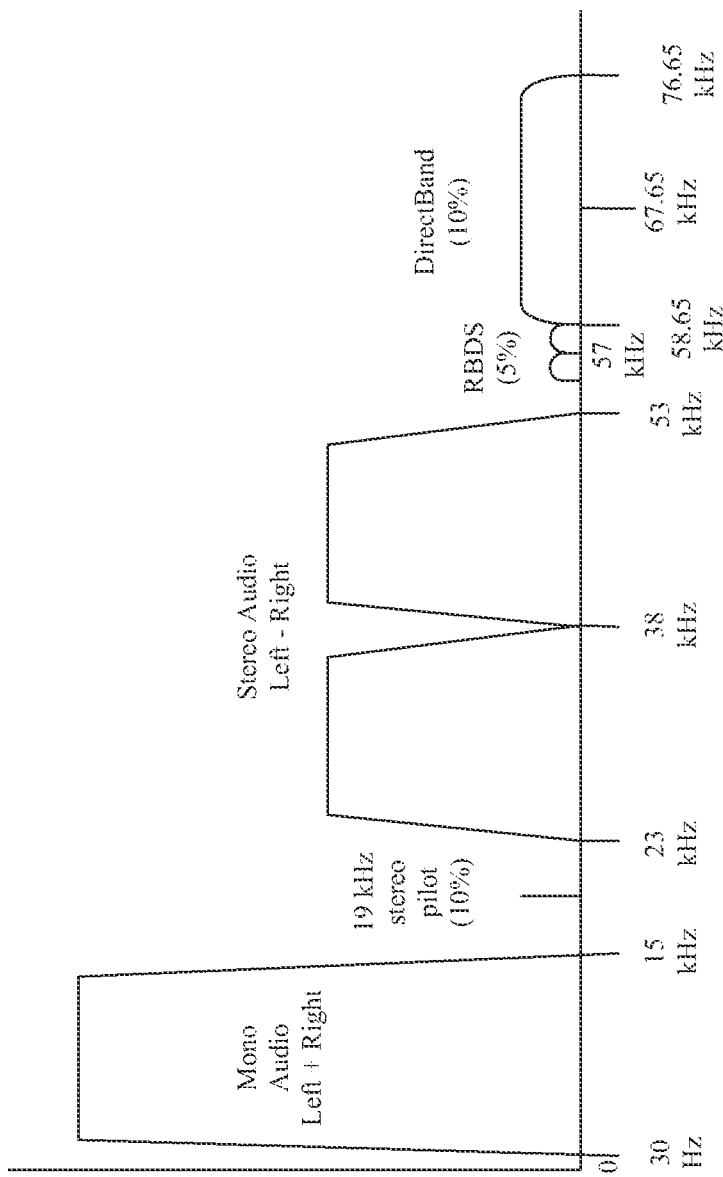
FIG. 1 depicts a typical spectrum of a composite baseband signal used in an FM broadcasting systems.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

A. Introduction

The following detailed description of the present invention refers to the accompanying drawings that illustrate exemplary embodiments consistent with this invention. Other embodiments are possible, and modifications may be made to the embodiments within the spirit and scope of the present invention. Therefore, the following detailed description is not meant to limit the invention. Rather, the scope of the invention is defined by the appended claims.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

Systems and methods are described herein that can enhance the output audio quality of an FM receiver when the input FM radio signal is weak and/or the CNR is low. Embodiments described herein achieve the foregoing by enhancing the stereo separation and reducing the hissing background noise and noise pulses (static) in the FM receiver output audio signal. Such embodiments can provide very significant, and sometimes even dramatic, audio quality improvements that can be easily perceived by the users of the FM receiver.

The primary techniques used for enhancing the output audio quality of an FM receiver described herein include (1) the application of single-channel noise suppression to each of the L+R and L−R signals; (2) the application of a technique referred to herein as "pop suppression" to detect and remove impulsive noise ("noise pulses" or "static") from the L+R signal when the CNR drops below a certain threshold; and (3) the application of a technique referred to herein as "fast fading compensation" to replace noisy segments of the L−R and L+R signals with replacement segments synthesized using a form of waveform extrapolation.

As noted above, various embodiments described herein apply single-channel noise suppression to the L−R signal. This approach is premised on the recognition that the problem of enhancing the stereo separation and reducing the hissing noise and static in the FM receiver can be treated as a single-channel noise suppression problem. In particular, by suppressing the noise in the L−R signal using single-channel noise suppression techniques, embodiments described herein do not need to reduce the weight placed on the L−R signal as is done by conventional stereo blending scheme when reconstructing the L and R signals. Thus, not only can the hissing background noise in the L−R signal (and eventually in the L and R signals) be reduced by a larger degree than stereo blending, but also the stereo separation (the degree of stereo effects) can be enhanced at the same time as a by-product.

The L+R signal also has noise, albeit at a lower level than the L−R noise. Therefore, embodiments described herein also apply single-channel noise suppression to the L+R signal. A less aggressive form of single-channel noise suppression may be applied to the L+R signal than the single-channel noise suppression that is applied to the L−R signal.

A prerequisite for successful single-channel noise suppression is the ability to estimate the magnitude spectrum of the background noise (called the "noise floor") in a reliable manner. When applied to speech signals in telecommunication applications, conventional single-channel noise suppression techniques typically analyze the speech signal directly and estimate the noise floor during the time periods of inter-syllable and inter-sentence silence when there is no active speech signal and only the background noise is present. In contrast, in FM enhancement applications, the audio signal is often a music signal and, consequently, there may be very few time periods during which there is only background noise. This makes it difficult to estimate the noise floor reliably by analyzing the audio signal directly. Embodiments described herein circumvent this problem by deriving the noise floor not by directly analyzing the audio signal but by using other indirect methods that can give reasonably reliable estimates of noise floor regardless of whether the audio signal is present and thus "overwhelms" the noise.

As also noted above, various embodiments described herein apply a technique referred to as "pop suppression" to detect and remove noise pulses from the L+R signal when the CNR goes below a certain threshold. In particular, when the CNR of the input FM radio signal goes below a certain threshold (typically around 12 dB), noise pulses appear in the L+R and L−R signals. Embodiments described herein apply fairly aggressive single-channel noise suppression to the L−R signal at such a low CNR, thereby reducing the noise-suppressed L−R signal to nearly zero. Consequently, noise pulses in the L−R signal will not be an issue in such embodiments. On the other hand, such embodiments may apply only a moderate amount of single-channel noise suppression to the L+R signal at such a low CNR and thus the noise pulses may still be audible after the application of noise suppression. Thus, embodiments described herein apply a separate processing step to detect and then remove such noise pulses in the L+R signal. This is called "pop suppression" because a noise pulse looks like a pop in the signal.

The inventors have recognized that all isolated noise pulses in the L+R signal have very similar shapes and durations, although sometimes multiple pulses can be on top of each other. Thus, embodiments described herein leverage this fact by using a pulse shape "codebook" to detect the noise pulses. In certain implementations, the pulse shape codebook contains noise pulse templates obtained by sampling a single representative noise pulse at different phases as well as noise pulse templates that are intended to represent multiple overlapping noise pulses. Embodiments described herein also use short-term and long-term linear prediction to remove the underlying audio signal as much as possible before feeding the resulting prediction residual to the pulse detection step. Once a sufficiently good match of pulse shape is obtained with one of the templates in the pulse shape codebook, the best-matching pulse template is subtracted from the audio signal after optimal scaling. Such a pop suppression scheme works very well and can remove most of the noise pulses at CNR levels down to 8 to 9 dB in certain implementations.

As further noted above, various embodiments described herein apply a technique referred to herein as "fast fading compensation" to replace noisy segments of the L−R and L+R signals with segments synthesized using a form of waveform extrapolation. "Fast fading" refers to rapid drops in the CNR of the input FM radio signal to very low levels (e.g., less than 4 dB). Such rapid drops may occur frequently, for example, when an FM radio listener drives through a series of "fading regions" in which the FM radio signal is subject to multipath distortion or blocking. Embodiments described herein are premised on the recognition that if the segments of the L−R and L+R signals affected by fast fading are sufficiently short, they may be replaced using techniques that are somewhat similar to those used to replace lost packets and erased frames that carry speech signals in telecommunication applications. For example, in accordance with various embodiments, a novel form of waveform extrapolation may be used to replace segments of the L−R and L+R signals impacted by fast fading. Such an approach can serve to significantly improve the audio output signal quality during fast fading conditions.

Embodiments described herein also advantageously estimate the CNR of the received FM signal in a continuous and dynamic manner and apply each of pop suppression, L−R noise suppression, L+R noise suppression, L−R fast fading compensation and L+R fast fading compensation in a manner that is intended to maximize the output audio quality given the current estimated CNR.

Two main embodiments of a system for enhancing the audio quality of an FM receiver will now be described. These two main embodiments are distinguished by the indirect method that is used to estimate the L−R noise floor, the L+R noise floor, and the CNR. The estimated L−R noise floor is used to perform single-channel noise suppression on the L−R signal, the estimated L+R noise floor is used to perform single-channel noise suppression on the L+R signal, and the estimated CNR is used to control whether and/or to what degree pop suppression, noise suppression and fast fading compensation are performed.

Section B will describe the first main embodiment. In this embodiment, special hardware is implemented in the FM stereo decoder that produces a "quadrature-demodulated L−R noise." The basic idea is to demodulate the L−R signal with a special carrier that is 90 degrees out of phase with the carrier that is normally used to demodulate the L−R signal. Because this special carrier is "orthogonal" to the normal carrier for the L−R signal, it will not pick up the L−R signal and will instead produce a quadrature-demodulated version of the L−R noise. Such quadrature-demodulated L−R noise will not have the same sample values as the true noise in the demodulated L−R signal, but will have roughly the same average magnitude spectrum when compared with the true noise in the demodulated L−R signal. Thus, the L−R noise floor can easily and reliably be obtained by computing the magnitude spectrum of this quadrature-demodulated L−R noise. Once the L−R noise floor is obtained, the L+R noise floor can then be estimated through table look-up and interpolation along the frequency and CNR axes based on empirically derived tables. Furthermore, the average power of the quadrature-demodulated L−R noise is also used by this first main embodiment to estimate the CNR.

Section C will describe the second main embodiment. In this embodiment, it is assumed that no special hardware is available to produce the quadrature-demodulated L−R noise. In this case, the L+R signal is sampled at a high enough sampling rate to allow the extraction of the stop band signal between 15 and 23 kHz (see FIG. 1). After suppressing the 19 kHz stereo pilot tone and possible further band selection to avoid some spurious tones, the average power of this stop band signal can then be combined with table look-up and interpolation along the frequency and CNR axes to estimate the L−R noise floor, L+R noise floor, and CNR based on empirically derived tables.

In either embodiment, other than the estimation of CNR and L+R and L−R noise floors, the core operations of single-channel noise suppression, pop suppression, and fast fading compensation can remain essentially the same.

Section D will provide some concluding remarks.

Figure 2:
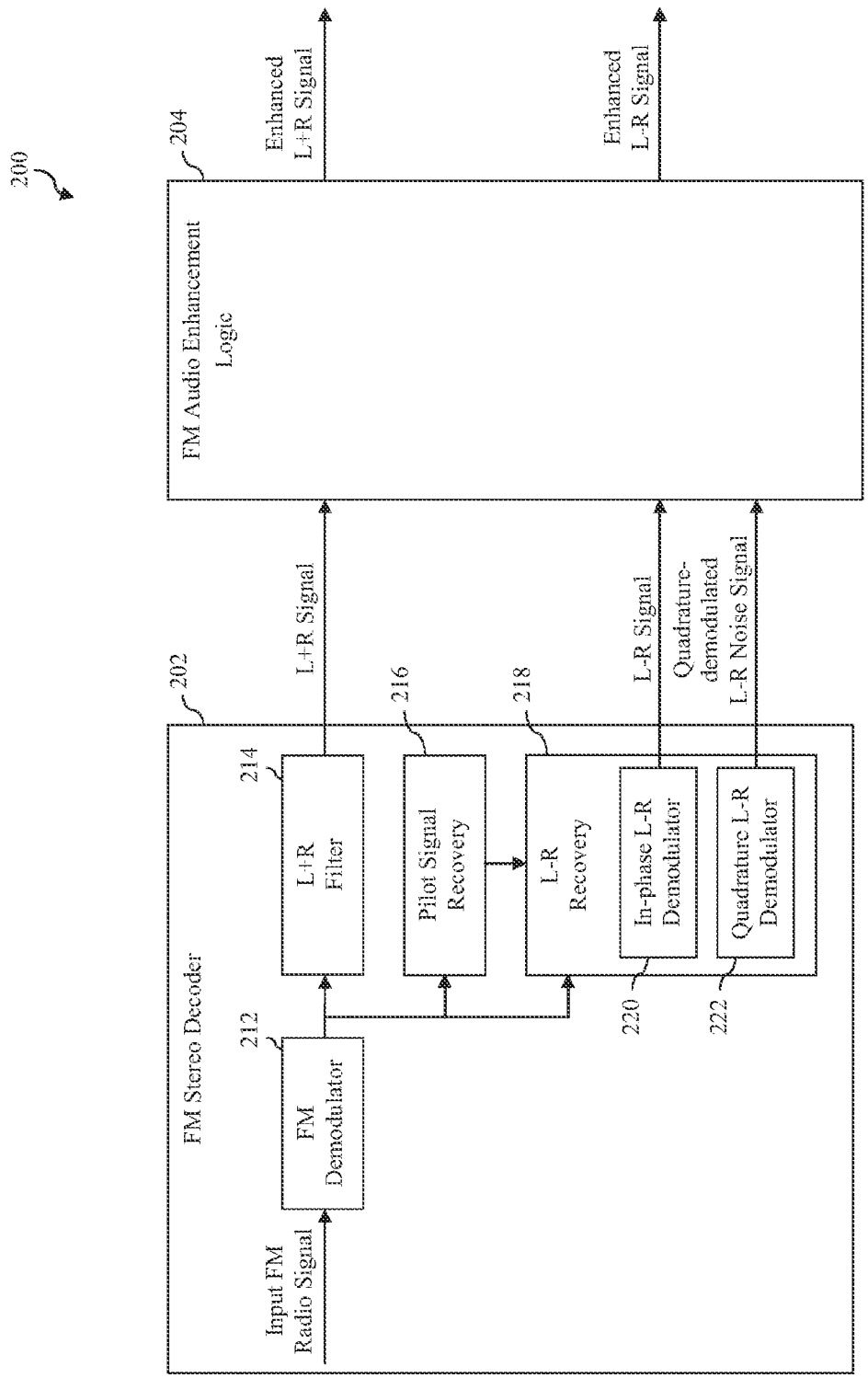
FIG. 2 is a block diagram of an example system for enhancing the audio quality of an FM receiver in accordance with a first main embodiment, the system including an FM stereo decoder and FM audio enhancement logic.

B. First Example System and Method for Enhancing Audio Quality of an FM Receiver FIG. 2 is a block diagram of an example system 200 for enhancing the audio quality of an FM receiver in accordance with a first main embodiment. System 200 may be implemented, for example, as an integrated part of an FM receiver or as an integrated part of a system that includes an FM receiver. As shown in FIG. 2, system 200 includes at least an FM stereo decoder 202 and FM audio enhancement logic 204. Each of these components will now be briefly described.

Generally speaking, FM stereo decoder 202 is a component that is configured to perform signal processing operations on an input FM radio signal in order to produce an L+R signal, an L−R signal and a quadrature-demodulated L−R noise signal. FM stereo decoder 202 may receive the input FM radio signal, for example, from an antenna or from a signal processing component that is connected to an antenna (e.g., a downsampler). In one embodiment, FM stereo decoder 202 is implemented in hardware, using analog and/or digital circuits. As shown in FIG. 2, FM stereo decoder 202 includes at least an FM demodulator 212, an L+R filter 214, pilot signal recovery logic 216 and L−R recovery logic 218.

FM demodulator 212 operates to frequency demodulate the input FM radio signal to produce a composite baseband signal, which is then received by each of L+R filter 214, pilot signal recovery logic 216 and L−R recovery logic 218. In this embodiment, the composite baseband signal has a spectrum similar to that shown in FIG. 1. L+R filter 214 operates to low-pass filter the composite baseband signal to recover the L+R signal that occupies the baseband range of 30 Hz to 15 kHz. Pilot signal recovery logic 216 processes the composite baseband signal to recover the pilot tone located at 19 kHz. L−R recovery logic 218 is configured to use the 19 kHz pilot tone to regenerate the L−R signal with the correct phase. In particular, L-R recovery logic 218 includes an in-phase L-R demodulator 220 that demodulates the composite baseband signal with a carrier that is in-phase with the pilot tone to produce the L-R signal.

As further shown in FIG. 2, L-R recovery logic 218 also includes a quadrature-phase L-R demodulator 222 that demodulates the composite baseband signal with a carrier that is 90 degrees out of phase with the pilot tone to produce the quadrature-demodulated L-R noise signal. As noted above, the quadrature-demodulated L-R noise signal will not have the same sample values as the true noise in the L-R signal, but will have roughly the same average magnitude spectrum when compared with the true noise in the demodulated L-R signal.

As further shown in FIG. 2, the L+R signal, the L-R signal and the quadrature-demodulated L-R noise signal produced by FM stereo decoder 202 are passed to FM audio enhancement logic 204. In one implementation, each of these signals is a 32 kHz signal. FM audio enhancement logic 204 processes the L+R signal in a manner to be described herein to produce an enhanced L+R signal. FM audio enhancement logic 204 also processes the L-R signal in a manner to be described herein to produce an enhanced L-R signal. FM audio enhancement logic 204 uses the quadrature-demodulated L-R noise signal in a manner to be described herein to estimate a CNR of the input FM radio signal and to estimate noise floors of the L-R and L+R signals. The estimated CNR and the estimated noise floors are used to drive certain aspects of the processing of the L+R and L-R signals, as will also be described herein.

Figure 3:
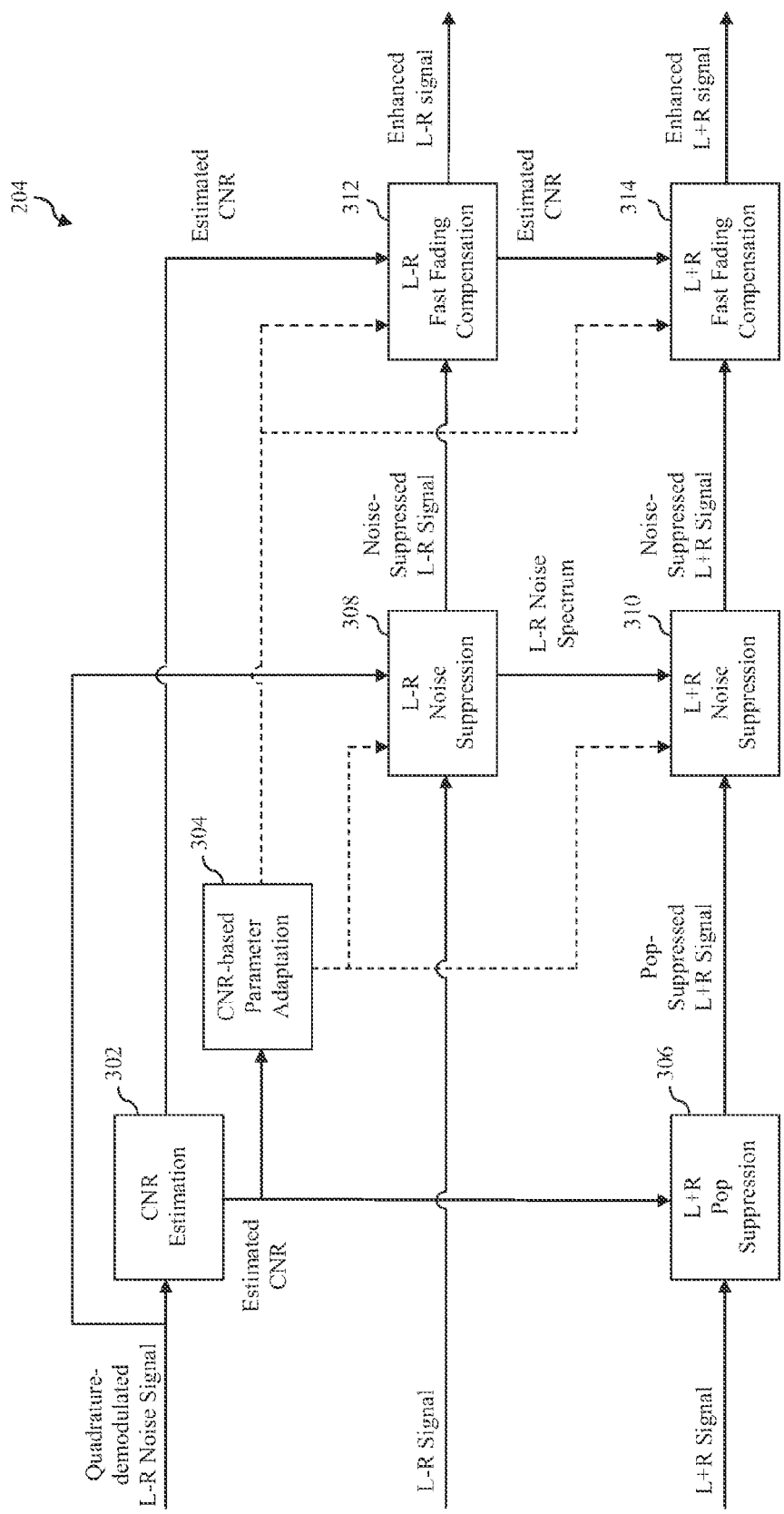
FIG. 3 is a block diagram that shows various components of the FM audio enhancement logic of FIG. 2 in accordance with an embodiment.

FIG. 3 is a block diagram that shows various components of FM audio enhancement logic 204 in accordance with an embodiment. As shown in FIG. 3, FM audio enhancement logic 204 includes CNR estimation logic 302, CNR-based parameter adaptation logic 304, L+R pop suppression logic 306, L-R noise suppression logic 308, L+R noise suppression logic 310, L-R fast fading compensation logic 312 and L+R fast fading compensation logic 314. Each of the components of FM audio enhancement logic 204 may be implemented in hardware, software, or as a combination of hardware or software. In accordance with certain embodiments, one or more of the components of FM audio enhancement logic 204 are implemented as firmware that is executed by a processing unit, wherein the processing unit may be included within an FM receiver of which FM audio enhancement logic 204 is a part or may be connected to such an FM receiver.

In accordance with one implementation, each of the components shown in FIG. 3 operates on a frame-by-frame basis. The frame size may be, for example, in the range of 5 milliseconds (ms) to 20 ms. In one particular implementation, a frame size of 8 ms is used. In accordance with an implementation in which the L+R and L-R signals are sampled at 32 kHz, each 8 ms frame will consist of 256 samples.

As shown in FIG. 3, CNR estimation logic 302 operates to receive the quadrature-demodulated L-R noise signal that is produced by FM stereo decoder 202. CNR estimation logic 302 uses this signal to generate a current estimate of the CNR for each frame of the L-R and L+R signals. In particular, CNR estimation logic 302 determines an average power of the quadrature-demodulated L-R noise signal for a current frame and then generates an estimated CNR for the current frame based on that value. The estimated CNR for a frame is used to control whether and/or to what degree each of L+R pop suppression, noise suppression and fast fading compensation are performed for that frame.

Generally speaking, when the estimated CNR is very high, L+R pop suppression, noise suppression and fast fading compensation will not be performed because any signal modification will likely degrade the audio quality. However, as the estimated CNR decreases, noise suppression will be applied with a gradually increasing degree of aggressiveness. When the estimated CNR drops below a first threshold (e.g., 14 dB in accordance with certain embodiments), L+R pop suppression will be applied and when the estimated CNR drops below an even lower threshold (e.g., 4 dB in accordance with certain embodiments), fast fading compensation will be applied in accordance with still further embodiments.

In certain embodiments, a single estimated CNR is used to control whether and/or to what degree L+R pop suppression, noise suppression and fast fading compensation are performed for a given frame. In alternate embodiments, different estimated CNRs may be calculated for controlling various ones of these different operations. For example, a first estimated CNR may be calculated for controlling L+R pop suppression and a second estimated CNR may be calculated for controlling noise suppression. Calculating different estimated CNRs in this manner may be deemed desirable to allow certain processing blocks to process frames using slightly different frame boundaries, to allow different processing blocks to use estimated CNRs that have been determined using different degrees of smoothing (e.g., one processing block may use a smoothed estimated CNR while another processing block may use an instantaneous estimated CNR), or for other reasons.

CNR-based parameter adaption logic 304 uses an estimated CNR output by CNR estimation logic 302 to select various parameters that will be used to control the manner in which L-R noise suppression, L+R noise suppression, L-R fast fading compensation and L+R fast fading compensation are performed. The manner in which such parameters are selected based on the estimated CNR will be described in the sections below that describe those operations.

As noted above, L+R pop suppression logic 306 will perform pop suppression on the L+R signal to produce a pop-suppressed L+R signal when the estimated CNR received from CNR estimation logic 302 drops below a predefined threshold, which in one embodiment is 14 dB. Otherwise, L+R pop suppression logic 306 will output an unmodified version of the L+R signal as the pop-suppressed L+R signal. As will be explained in detail in Section B.3 below, when activated, L+R pop suppression logic 306 utilizes short-term and long-term linear prediction techniques to try to remove an underlying audio signal from the L+R signal. L+R pop suppression logic 306 then attempts to match pulses appearing in the prediction residual to the noise pulse templates in the pulse shape codebook in the prediction residual domain. If a sufficiently good match is obtained, L+R pop suppression logic 306 subtracts the best-matching noise pulse template from the audio signal after optimal scaling. By operating in this manner, an embodiment of L+R pop suppression logic 306 can remove most of the noise pulses appearing in the L+R signal at CNR levels as low as 8 to 9 dB in certain implementations.

Figure 4:
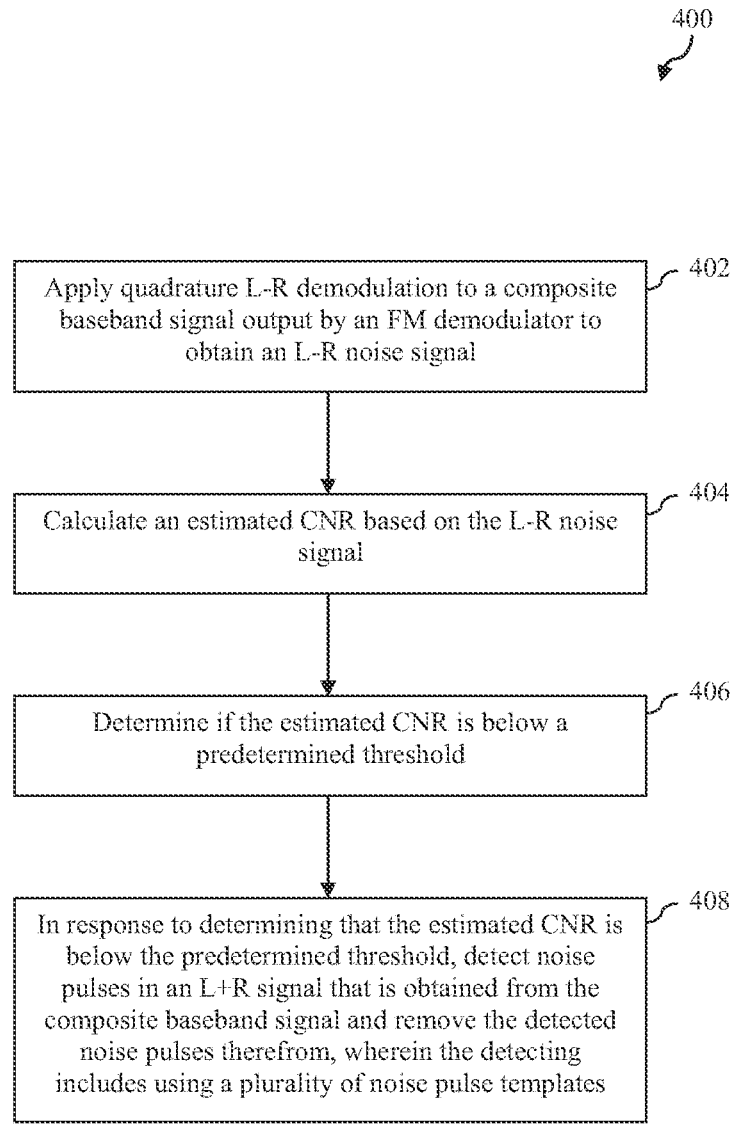
FIG. 4 depicts a high-level flowchart of a manner in which L+R pop suppression is performed in accordance with the first main embodiment.

FIG. 4 depicts a high-level flowchart 400 of the manner in which L+R pop suppression is performed in accordance with an embodiment. The method of flowchart 400 may be performed, for example, by the components of system 200 as described above in reference to FIGS. 2 and 3. However, the method is not limited to that implementation.

As shown in FIG. 4, the method of flowchart 400 begins at step 402 in which quadrature L-R demodulation is applied to a composite baseband signal output by an FM demodulator to obtain a quadrature-demodulated L-R noise signal (subsequently referred to herein as "L-R noise signal" for the sake of brevity). By way of example, this step may be performed by quadrature L−R demodulator 222 as described above in reference to FIG. 2.

At step 404, an estimated CNR is calculated based on the L−R noise signal. By way of example, this step may be performed by CNR estimation logic 302 as described above in reference to FIG. 3. Additional details concerning how the estimated CNR may be calculated will be presented below in Section B.1.

At step 406, it is determined if the estimated CNR is below a predetermined threshold (e.g., 14 dB).

At step 408, in response to determining that the estimated CNR is below the predetermined threshold, noise pulses are detected in an L+R signal that is obtained from the composite baseband signal and the detected noise pulses are removed therefrom, wherein the detecting of noise pulses includes using a plurality of noise pulse templates. By way of example, steps 406 and 408 may be performed by L+R pop suppression logic 306 as described above in reference to FIG. 3. Additional details concerning how L+R pop suppression logic 306 may operate will be presented below in Section B.3.

L−R noise suppression logic 308 is configured to receive the L−R signal and apply single-channel noise suppression thereto in the frequency domain in order to produce a noise-suppressed L−R signal. In a similar manner, L+R noise suppression logic 310 is configured to receive the pop-suppressed L+R signal from L+R pop suppression logic 306 and apply single-channel noise suppression thereto in the frequency domain in order to produce a noise-suppressed L+R signal.

The general techniques used by L−R noise suppression logic 308 and L+R noise suppression logic 310 to perform single-channel noise suppression in the frequency domain are modeled on techniques described in commonly-owned, co-pending U.S. patent application Ser. No. 12/897,548 to Thyssen, entitled "Noise Suppression System and Method" and filed on Oct. 4, 2010, the entirety of which is incorporated by reference herein. As described in that application, an amount of noise suppression gain to be applied to each frequency sub-band of a frequency domain representation of an audio signal can be determined based on a desired noise attenuation (which may be flat or shaped) and an SNR for each frequency sub-band. In the present embodiment, the desired noise attenuation for each of L−R and L+R noise suppression is selected based on the estimated CNR determined by CNR estimation logic 302, the SNRs for the frequency sub-bands of the L−R signal are obtained using the power spectra of the L−R signal and the L−R noise signal, and the SNRs for the frequency sub-bands of the L+R signal are obtained using the power spectrum of the pop-suppressed L+R signal and a power spectrum of an L+R noise signal that is estimated based on the power spectrum of the L−R noise signal (which is determined by L−R noise suppression logic 308 and passed to L+R noise suppression logic as shown in FIG. 3).

Figure 5:
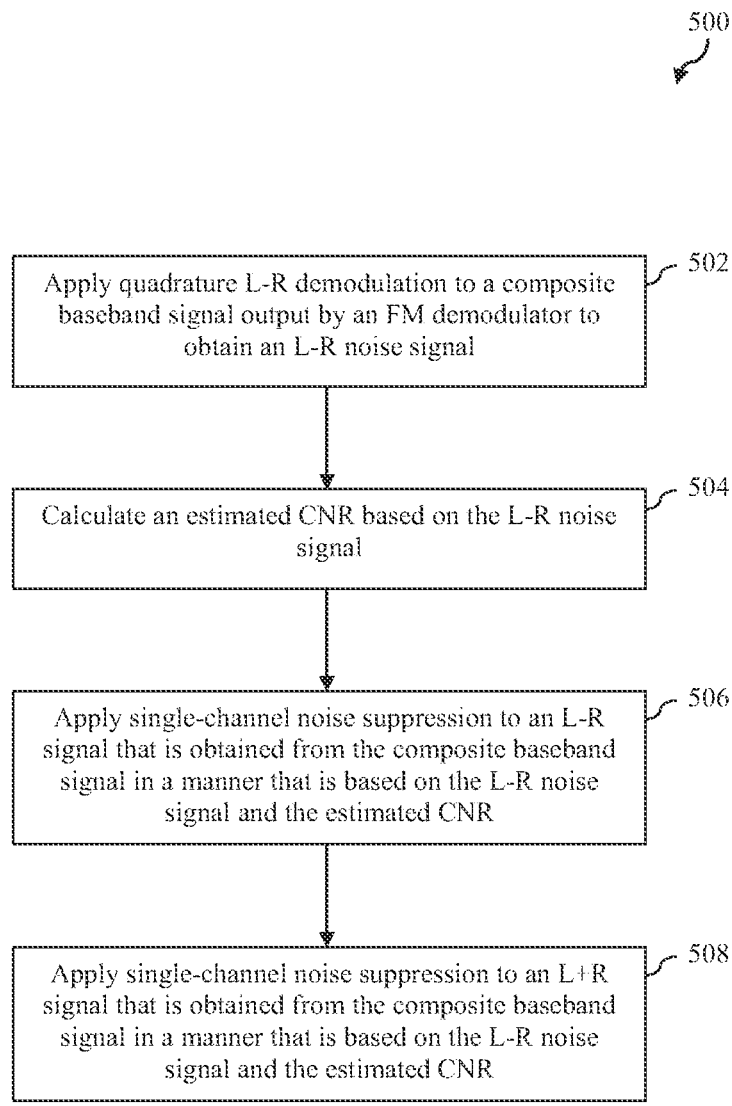
FIG. 5 depicts a high-level flowchart of a manner in which L−R and L+R noise suppression are performed in accordance with the first main embodiment.

FIG. 5 depicts a high-level flowchart 500 of a manner in which L−R and L+R noise suppression are performed in accordance with an embodiment. The method of flowchart 500 may be performed, for example, by the components of system 200 as described above in reference to FIGS. 2 and 3. However, the method is not limited to that implementation.

As shown in FIG. 5, the method of flowchart 500 begins at step 502 in which quadrature L−R demodulation is applied to a composite baseband signal output by an FM demodulator to obtain an L−R noise signal. By way of example, this step may be performed by quadrature L−R demodulator 222 as described above in reference to FIG. 2.

At step 504, an estimated CNR is calculated based on the L−R noise signal. By way of example, this step may be performed by CNR estimation logic 302 as described above in reference to FIG. 3. Additional details concerning how the estimated CNR may be calculated will be presented below in Section B.1.

At step 506, single-channel noise suppression is applied to an L−R signal that is obtained from the composite baseband signal in a manner that is based on the L−R noise signal and the estimated CNR. By way of example, this step may be performed by L−R noise suppression logic 308 as described above in reference to FIG. 3.

At step 508, single-channel noise suppression is applied to an L+R signal that is obtained from the composite baseband signal in a manner that is based on the L−R noise signal and the estimated CNR. By way of example, this step may be performed by L+R noise suppression logic 310 as described above in reference to FIG. 3. It is noted that, in accordance with this particular example, the "L+R signal that is obtained from the composite baseband signal" refers to the pop-suppressed version of that signal that is produced by L+R pop suppression logic 306.

Figure 6:
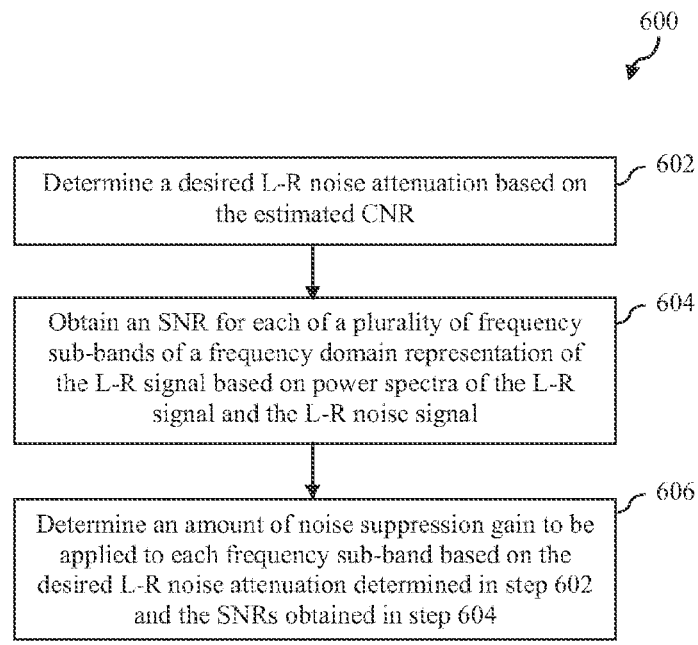
FIG. 6 depicts a high-level flowchart of a manner in which single-channel L−R noise suppression is performed in accordance with the first main embodiment.

FIG. 6 depicts a high-level flowchart 600 of a manner in which step 506 of flowchart 500 may be performed in accordance with an embodiment. As shown in FIG. 6, the method of flowchart 600 begins at step 602 in which a desired L−R noise attenuation is determined based on the estimated CNR. At step 604, an SNR is obtained for each of a plurality of frequency sub-bands of a frequency domain representation of the L−R signal based on the power spectra of the L−R signal and the L−R noise signal. At step 606, an amount of noise suppression gain to be applied to each frequency sub-band of the frequency domain representation of the L−R signal is determined based on the desired L−R noise attenuation determined in step 602 and the SNRs obtained in step 604. Additional details concerning how L−R noise suppression logic 308 may operate will be presented below in Section B.4.

Figure 7:
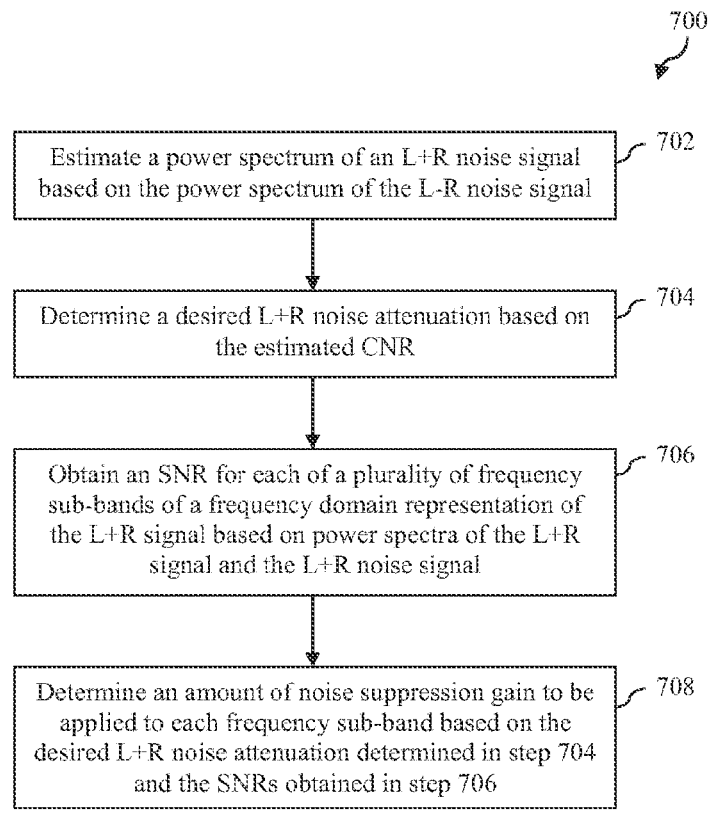
FIG. 7 depicts a high-level flowchart of a manner in which single-channel L+R noise suppression is performed in accordance with the first main embodiment.

FIG. 7 depicts a high-level flowchart 700 of a manner in which step 508 of flowchart 500 may be performed in accordance with an embodiment. As shown in FIG. 7, the method of flowchart 700 begins at step 702 in which a power spectrum of an L+R noise signal is estimated based on the power spectrum of the L−R noise signal. At step 704, a desired L+R noise attenuation is determined based on the estimated CNR. At step 706, an SNR is obtained for each of a plurality of frequency sub-bands of a frequency domain representation of the L+R signal based on the power spectra of the L+R signal and the L+R noise signal. At step 708, an amount of noise suppression gain to be applied to each frequency sub-band of the frequency domain representation of the L+R signal is determined based on the desired L+R noise attenuation determined in step 704 and the SNRs obtained in step 706. Additional details concerning how L+R noise suppression logic 310 may operate will be presented below in Section B.4.

L−R fast fading compensation logic 312 is configured to receive the noise-suppressed L−R signal produced by L−R noise suppression logic 308 and apply fast fading compensation thereto in order to produce an enhanced L−R signal. In a similar manner, L+R fast fading compensation logic 314 is configured to receive the noise-suppressed L+R signal produced by L+R noise suppression logic 310 and apply fast fading compensation thereto in order to produce an enhanced L+R signal. As discussed above, fast fading compensation involves utilizing a novel form of waveform extrapolation to replace noisy segments of the L−R and L+R signals at very low CNRs.

Figure 8:
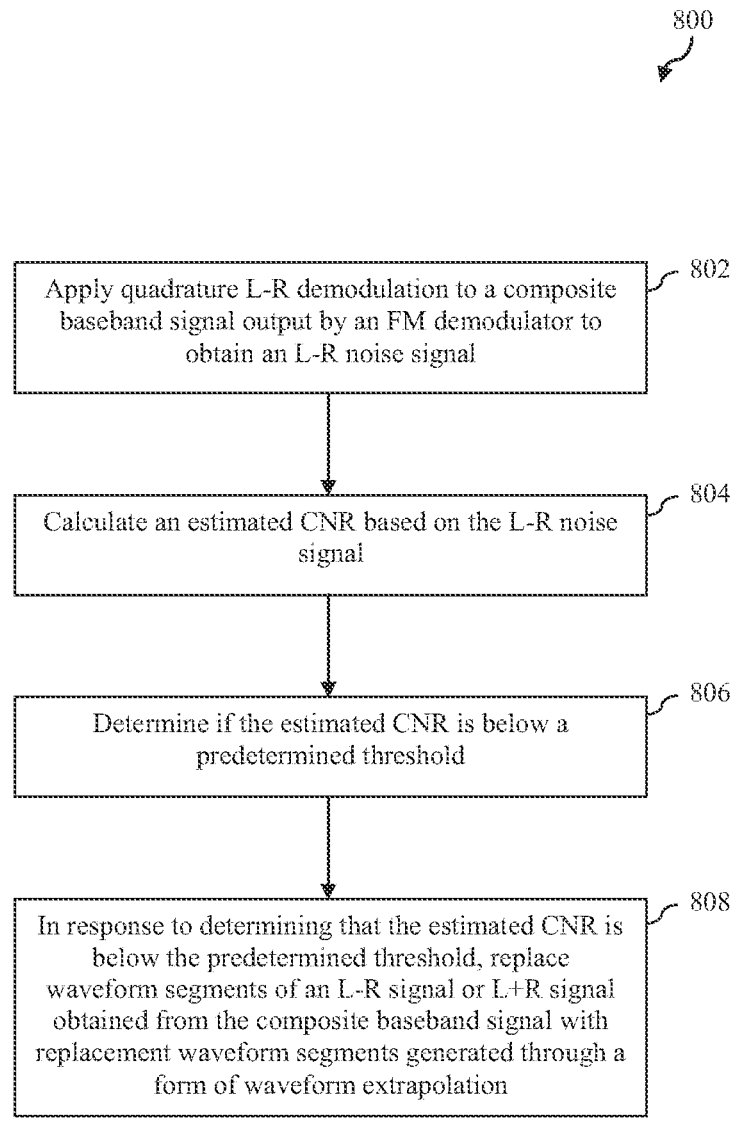
FIG. 8 depicts a high-level flowchart of a manner in which L−R and L+R fast fading compensation are performed in accordance with the first main embodiment.

FIG. 8 depicts a high-level flowchart 800 of the manner in which L−R and L+R fast fading compensation are performed in accordance with an embodiment. The method of flowchart 800 may be performed, for example, by the components of system 200 as described above in reference to FIGS. 2 and 3. However, the method is not limited to that implementation.

As shown in FIG. 8, the method of flowchart 800 begins at step 802 in which quadrature L−R demodulation is applied to a composite baseband signal output by an FM demodulator to obtain an L−R noise signal. By way of example, this step may be performed by quadrature L−R demodulator 222 as described above in reference to FIG. 2.

At step 804, an estimated CNR is calculated based on the L−R noise signal. By way of example, this step may be performed by CNR estimation logic 302 as described above in reference to FIG. 3. Additional details concerning how the estimated CNR may be calculated will be presented below in Section B.1.

At step 806, it is determined if the estimated CNR is below a predetermined threshold (e.g., 4 dB).

At step 808, in response to determining that the estimated CNR is below the predetermined threshold, waveform segments of an L−R signal or L+R signal obtained from the composite baseband signal are replaced with replacement waveform segments generated through a form of waveform extrapolation. By way of example, steps 806 and 808 may be performed by either of L−R fast fading compensation logic 312 or L+R fast fading compensation logic 314 as described above in reference to FIG. 3. Additional details concerning how L−R fast fading compensation logic 312 and L+R fast fading compensation logic 314 may operate will be presented below in Section B.5.

The enhanced L−R signal and enhanced L+R signal produced by FM audio enhancement logic 204 may subsequently be combined in a well-known manner by an FM receiver to produce L and R channels of audio output.

The following sections will provide additional details concerning the manner of operation of the aforementioned components of FM audio enhancement logic 204. In particular, section B.1 will provide additional details concerning the operation of CNR estimation logic 302, section B.2 will provide additional details concerning the operation of CNR-based parameter adaptation logic 304, section B.3 will provide additional details concerning the operation of L+R pop suppression logic 306, section B.4 will provide additional details concerning the operation of L−R noise suppression logic 308 and L+R noise suppression logic 310, and section B.5 will provide additional details concerning the operation of L−R fast fading compensation logic 312 and L+R fast fading compensation logic 314.

1. CNR estimation

Figure 9:
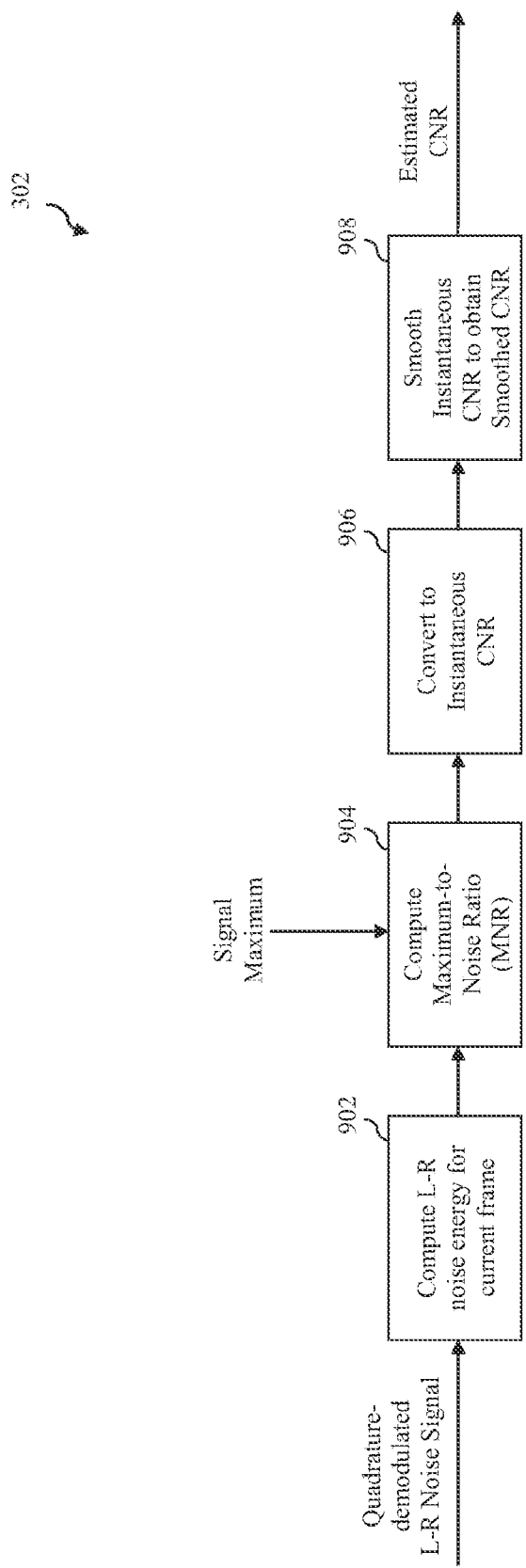
FIG. 9 is a block diagram of an example CNR estimator in accordance with one embodiment.

FIG. 9 is a block diagram that shows how CNR estimation logic 302 may be implemented in accordance with one example embodiment. As shown in FIG. 9, CNR estimation logic 302 may include a first logic block 902 that receives the quadrature-demodulated L−R noise signal and uses it to compute an L−R noise energy for a current frame. This step may involve, for example, obtaining a frequency domain representation of the quadrature-demodulated L−R noise signal and then summing up the energy across each sub-band of the frequency domain representation of the quadrature-demodulated L−R noise signal. In one embodiment, obtaining the frequency domain representation of the quadrature-demodulated L−R noise signal comprises taking a Fast Fourier Transform (FFT) of the quadrature-demodulated L−R noise signal. In a particular embodiment, a hardware-implemented FFT accelerator is used to efficiently perform this operation. In alternate embodiments, a time domain representation of the quadrature-demodulated L−R noise signal is used to compute the L−R noise energy for the current frame. A variety of well-known techniques for determining the energy of a time domain signal can be used to perform this operation.

Once the L−R noise energy has been obtained for the current frame, a second logic block 904 computes a ratio between a predetermined maximum signal energy for the L−R signal and the L−R noise energy, thereby yielding a maximum-to-noise ratio (MNR) for the current frame. The maximum signal energy for the L−R signal may comprise a fixed or configurable system parameter that may be determined empirically for a given implementation. The maximum signal energy provides a reference value that can be used to account for scaling that may be applied to the L−R signal prior to receipt of that signal by FM audio enhancement logic 204 and that enables a subsequent mapping to an instantaneous CNR to occur.

After the MNR has been computed for the current frame, a third logic block 906 converts the MNR to an instantaneous CNR for the current frame. In one embodiment, converting the MNR to the instantaneous CNR comprises obtaining a logarithmic value of the MNR and then subtracting a predetermined offset, wherein the predetermined offset comprises the difference between an MNR at which it has been observed that noise pulses appear in the L+R signal and a CNR at which it is expected that noise pulses will appear when there is no audio signal (e.g., 12 dB). Thus, for example, if it has been observed that noise pulses appear at an MNR of 30 dB for a given implementation, and 12 dB is the CNR at which it is expected that noise pulses will appear when there is no audio signal, then an offset of 18 dB will be subtracted from the MNR computed by second logic block 904 to obtain the instantaneous CNR. Still other methods may be used to determine the instantaneous CNR based on the computed MNR.

Once an instantaneous CNR has been obtained for the current frame, that instantaneous CNR is smoothed by a fourth logic block 908 to obtain a smoothed CNR for the current frame, which is then output by CNR estimator 302 as the estimated CNR for the current frame. Smoothing may be achieved for example, by computing a weighted sum of the instantaneous CNR determined for the current frame and a long-term running average of the instantaneous CNR determined for previous frames, although this example is not intended to be limiting.

As can be seen from the foregoing, the example implementation of FIG. 9 outputs a single estimated CNR. However, as was previously noted, CNR estimation logic 302 may output different estimated CNRs for controlling various ones of L+R pop suppression, noise suppression and fast fading compensation. For example, a first estimated CNR may be calculated for controlling L+R pop suppression and a second estimated CNR may be calculated for controlling noise suppression.

2. CNR-Based Parameter Adaptation

CNR-based parameter adaption logic 304 uses an estimated CNR output by CNR estimation logic 302 to select various parameters that will be used to control the manner in which L−R noise suppression will be performed by L−R noise suppression logic 308, the manner in which L+R noise suppression will be performed by L+R noise suppression logic 310, the manner in which L−R fast fading compensation will be performed by L−R fast fading compensation logic 312, and the manner in which L+R fast fading compensation will be performed by L+R fast fading compensation logic 314.

For L+R noise suppression, the estimated CNR is used to determine the power spectrum of the L+R noise based on the power spectrum of the L−R noise. For both L−R and L+R noise suppression, the estimated CNR is used to determine a desired noise attenuation, an amount of additional noise attenuation to be applied outside of a main signal band, an amount of soft-muting attenuation to be applied, and a frequency sub-band index at and above which any high-cut attenuation will be applied. Further details concerning how the estimated CNR is used to determine these parameters for performing L−R and L+R noise suppression will be provided below in Section B.4.

For L−R and L+R fast fading compensation, the estimated CNR is used both to determine if fast fading compensation will be applied at all, and, for frames where fast fading compensation is applied, to determine a weighting factor that is used to generate a replacement waveform as a weighted sum of a waveform to be replaced and a best-matching waveform segment obtained from a history buffer. Further details concerning how the estimated CNR is used to determine the weighting factor will be provided below in Section B.5.

3. L+R Pop Suppression

As noted above, the techniques applied by L+R pop suppression logic 306 are premised on the recognition that all isolated noise pulses in the L+R signal have very similar shapes and durations, although sometimes multiple pulses can be on top of each other. For example, it was observed in one FM receiver implementation that all isolated noise pulses in the L+R signal had a general shape consisting of a very large peak followed by a number of smaller peaks (with peak amplitudes confined to a fairly narrow amplitude range) and a duration of about 0.4 ms. Embodiments described herein leverage this fact by using a pulse shape "codebook" to detect the noise pulses. The pulse shape codebook includes a plurality of noise pulse templates obtained by sampling a single representative noise pulse at different phases.

For example, in accordance with one embodiment, a pulse shape codebook was generated, in part, by obtaining eight representative positive noise pulses and eight representative negative noise pulses from a segment of the demodulated L+R signal captured at 11 dB CNR and eight representative positive noise pulses and eight representative negative noise pulses from a segment of the demodulated L+R signal captured at 9 dB CNR. The thirty-two representative noise pulses were then smoothed by upsampling them from 48 kHz to 192 kHz, scaled, and time-aligned. After that, the amplitudes of the samples of the thirty-two scaled and time-aligned representative noise pulses were averaged together, resulting in the average noise pulse shown in FIG. 10.

Figure 10:
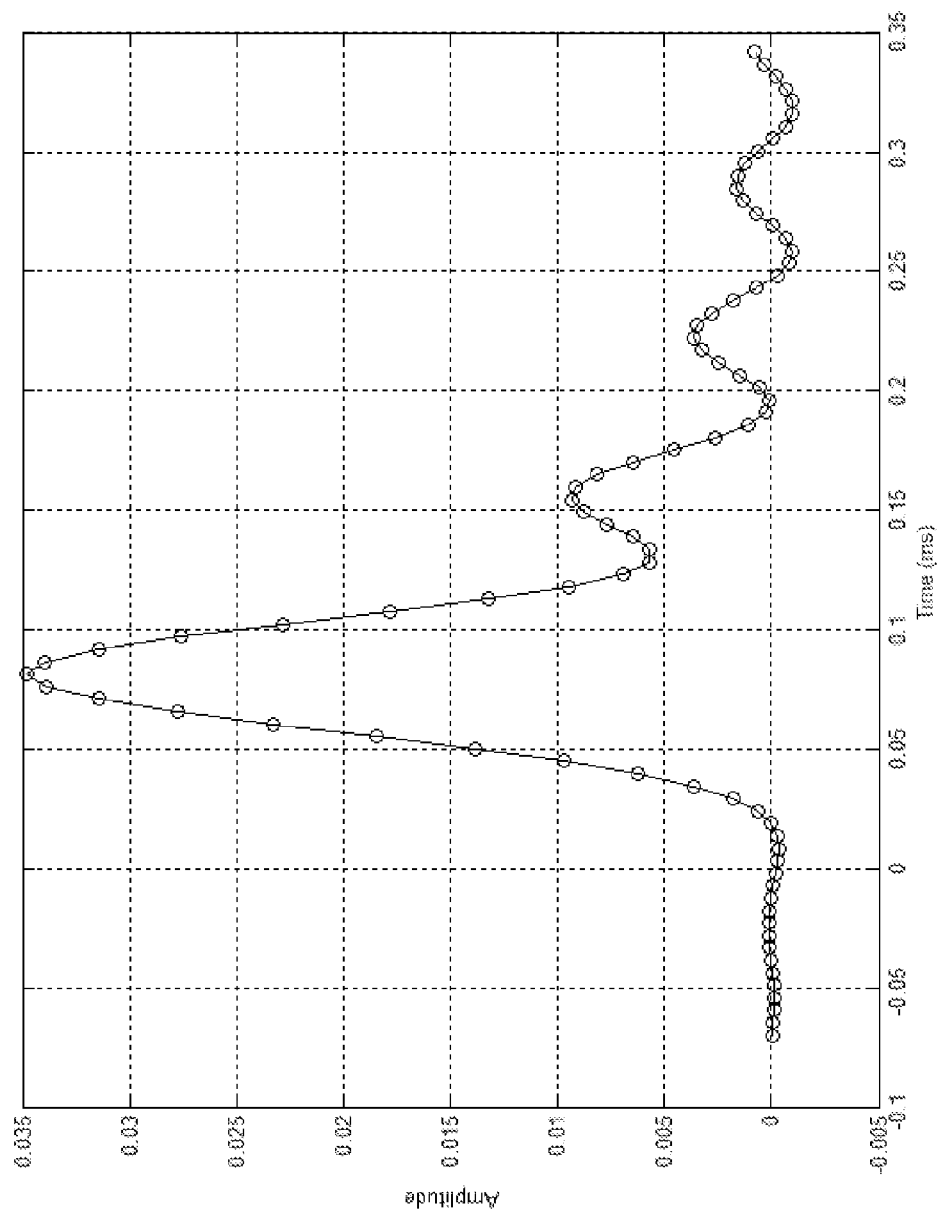
FIG. 10 illustrates the average shape of a number of scaled and time-aligned noise pulses appearing in an L+R signal recovered by a particular FM receiver at a CNR of less than 12 dB.

The average noise pulse shown in FIG. 10 was then sub-sampled at six different phases to produce six unnormalized noise pulse templates at 32 kHz, each consisting of nine samples. An offset was then determined for each sample of each unnormalized noise pulse template by interpolating between the magnitude of the first and ninth samples of the template and by subtracting the determined offset for each sample from the corresponding sample. This resulted in the first and ninth samples having zero magnitudes. The resulting unnormalized noise pulse templates with zero end points are shown in FIG. 11.

Figure 11:
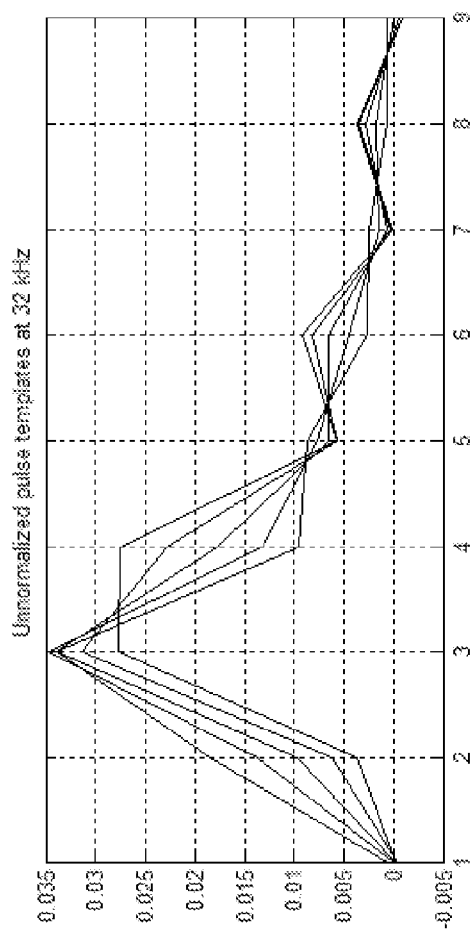
FIG. 11 illustrates six unnormalized noise pulse templates that may be used for performing pop suppression in accordance with an embodiment.
Figure 12:
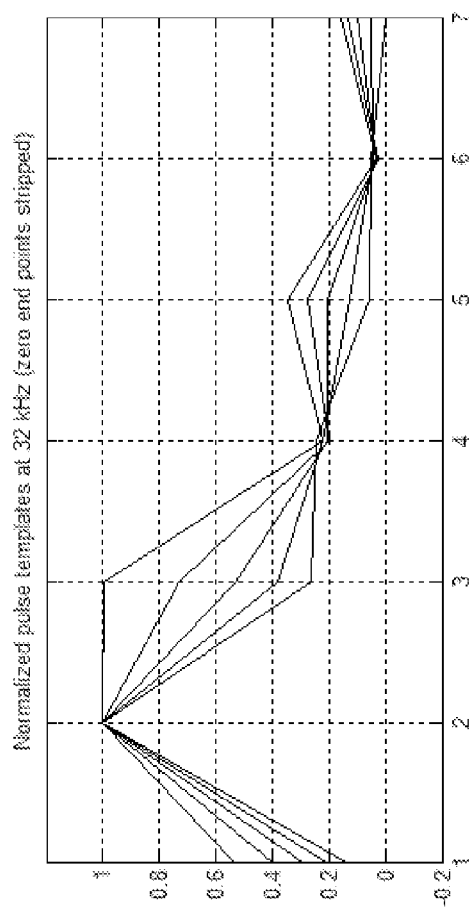
FIG. 12 illustrates six normalized noise pulse templates that may be used for performing pop suppression in accordance with an embodiment.

In one embodiment, each of the unnormalized noise pulse templates shown in FIG. 11 was divided by the magnitude of the peak located at the third sample thereof, resulting in six normalized noise pulse templates. In further accordance with this embodiment, the zero end points were not stored as part of the noise pulse templates in the pulse shape codebook since their values are the same for every template. This approach increases the efficiency of the noise pulse search and reduces the amount of memory required for storing the pulse shape codebook. FIG. 12 shows the resulting normalized noise pulse templates at 32 kHz with the zero end points stripped. As shown in FIG. 12, each normalized noise pulse template consists of seven samples.

In a further embodiment, additional noise pulse templates were generated to account for scenarios in which two noise pulses are overlapping. In accordance with a particular embodiment, such additional noise pulse templates were generated to account for scenarios where a second noise pulse lags a first noise pulse by only one or two samples in the 32 kHz domain. For scenarios where the second noise pulse lags the first noise pulse by three or four samples in the 32 kHz domain, special processing steps are instead used to detect such overlapping noise pulses. For scenarios where the second noise pulse lags the first noise pulse by five or more samples in the 32 kHz domain, it was observed that individually matching the noise pulses to "single-pulse" noise pulse templates yields satisfactory results.

The foregoing presented some exemplary methods for generating a codebook of noise pulse templates that may be used to perform L+R pop suppression in accordance with various techniques described herein. It is to be understood, however, that any of a variety of methods may be used to generate a codebook of suitable noise pulse templates and such methods are not necessarily limited to those described above. Furthermore, depending upon the design of the FM receiver, noise pulses appearing in the L+R signal may have a different characteristic shape than that described above. For example, the use of different filters having different impulse responses to recover the L+R signal may result in the generation of noise pulses having different characteristic shapes. Accordingly, different noise pulse templates may be derived to perform pop suppression for different FM receiver designs.

Figure 13:
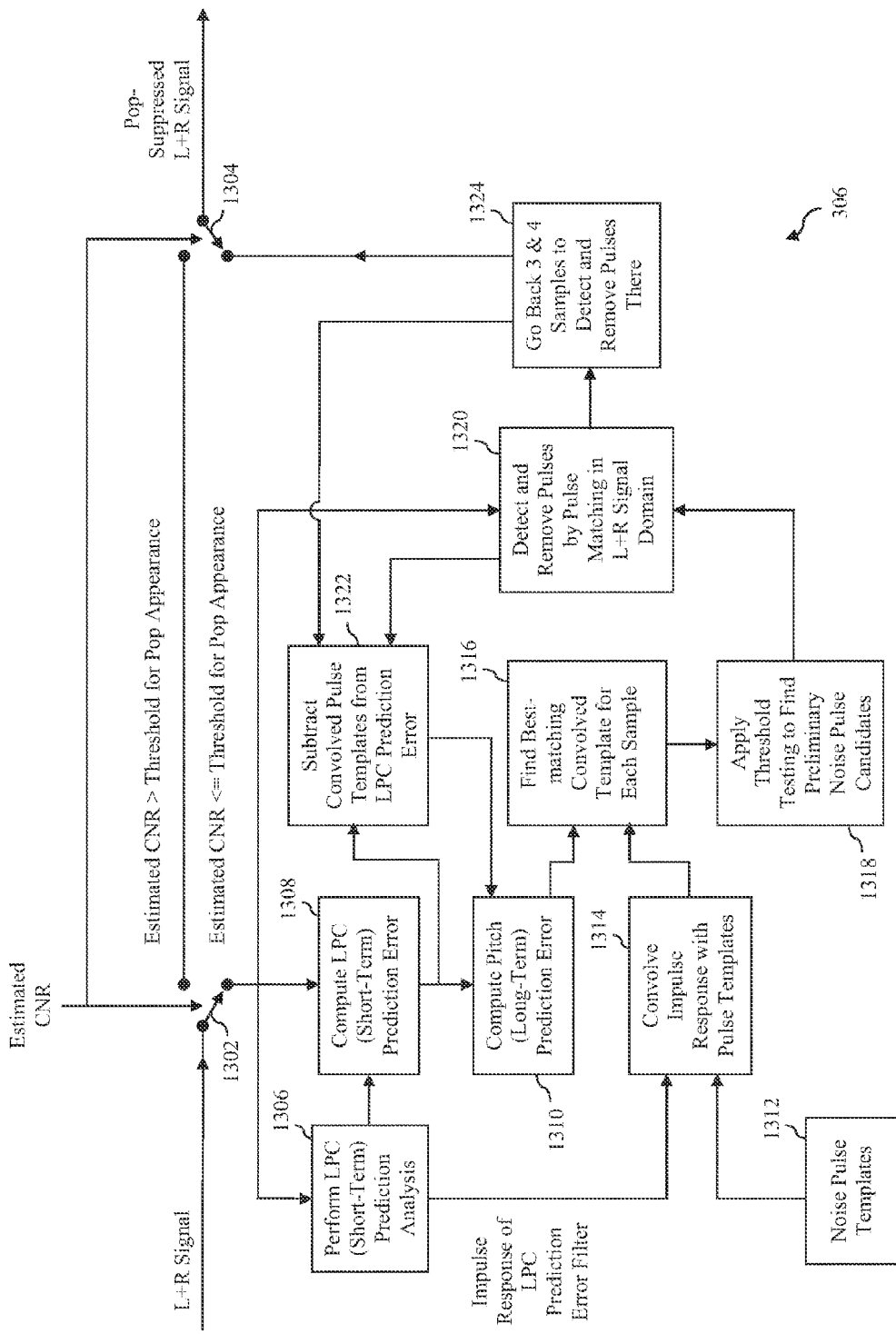
FIG. 13 is a block diagram of L+R pop suppression logic in accordance with an embodiment.

FIG. 13 is a block diagram of L+R pop suppression logic 306 in accordance with an example embodiment. As shown in FIG. 13, L+R pop suppression logic 306 includes a number of interconnected logic blocks, components or modules that operate together to perform the above-described operations. Depending upon the implementation, each of these components may be implemented in hardware, software, or as a combination of hardware and software. The manner in which each of these components operates will now be described.

With continued reference to FIG. 13, L+R pop suppression logic 306 includes switching logic, which is symbolically represented by a first switch 1302 and a second switch 1304. This switching logic compares an estimated CNR received from CNR estimation logic 302 with a threshold for pop appearance. If the estimated CNR exceeds the threshold, then the switching logic passes the L+R signal received from FM stereo decoder 202 directly to the output of L+R pop suppression logic 306 without modifying it. Symbolically, this would be represented in FIG. 13 by placing switches 1302 and 1304 in an "up" position. This bypassing of the pop suppression function is performed because, at higher CNRs, there will be very few or no noise pulses in the L+R signal and thus there will be no benefit to applying pop suppression. Rather, applying pop suppression at such higher CNRs can cause false detections to occur, which can actually result in the undesired introduction of noise pulses into the L+R signal.

However, if the estimated CNR is less than or equal to the threshold for pop suppression, then the switching logic causes the L+R signal received from FM stereo decoder 202 to be passed to logic blocks 1306, 1308 and 1320 for the purposes of performing pop suppression and causes a processed L+R signal produced by logic block 1324 to be output as the pop-suppressed L+R signal produced by L+R pop suppression logic 306. Symbolically, this is represented in FIG. 13 by showing switches 1302 and 1304 in a "down" position.

The threshold for pop suppression may vary depending upon the implementation. In a particular embodiment, the threshold for pop suppression is set to the CNR at which noise pulses start to appear in the L+R signal in pure thermal noise conditions and in the absence of an audio signal, plus a configurable "safety margin." For example, in accordance with such an embodiment, if the CNR at which noise pulses start to appear in the L+R signal in pure thermal noise conditions and in the absence of an audio signal is 12 dB and the configurable safety margin is 2 dB, then the threshold for pop suppression will be 14 dB. Still other methods may be used to determine the threshold for pop appearance.

In some embodiments, it is possible that false detection of noise pulses will occur even when the estimated CNR is less than or equal to the threshold for pop suppression. However, it may nevertheless be determined that the benefit of removing actual noise pulses at such an estimated CNR far outweigh a slight signal degradation that may result from false detection of noise pulses.

As noted above, if the estimated CNR is less than or equal to the threshold for pop suppression, then the switching logic causes the L+R signal received from FM stereo decoder 202 to be passed to logic blocks 1306, 1308 and 1320 for the purposes of performing pop suppression. Logic block 1306 performs a so-called linear predictive coding (LPC) analysis (also referred to as a short-term prediction analysis) on the current frame of the L+R signal in the time domain. Logic block 1306 performs the LPC analysis to determine the coefficients of an LPC predictor that predicts the value of each sample of the current frame as the weighted sum of a number of prior samples. Logic block 1308 uses the LPC predictor obtained by logic block 1306 to compute an LPC prediction error, which may also be referred to as the short-term prediction error or short-term prediction residual. In particular, for each sample in the current frame of the L+R signal, logic block 1308 subtracts the predicted value of the sample obtained using the LPC predictor from the actual value of the sample to obtain a sample of the LPC prediction error. The foregoing operations are intended to produce a representation of the L+R signal from which the short-term redundancies of the audio signal have been removed.

In one embodiment, in order to avoid removing noise pulses when computing the LPC prediction error, an LPC predictor is used that predicts the value of each sample of the current frame as the weighted sum of a number of prior samples, wherein the prior samples are not adjacent to each other or to the current sample. Such LPC prediction is referred to herein as a "sparse LPC prediction." For example, in one embodiment, each prior sample used for LPC prediction is two samples away from each other prior sample and the prior sample that is closest to the current sample is two samples away from the current sample. It has been observed that such an LPC predictor will be unlikely to predict the noise pulses represented by the noise pulse templates described above and thus the use of such an LPC predictor will help ensure that noise pulses are not removed from the LPC prediction error as a result of the operations of logic blocks 1306 and 1308. However it has also been observed that such an LPC predictor will still provide a satisfactory degree of accuracy in performing the short-term prediction function.

In accordance with a particular embodiment, a $30^{th}$-order sparse LPC predictor is used that predicts the current sample as the weighted sum of 30 prior samples wherein each prior sample is two samples away from each other prior sample and the prior sample that is closest to the current sample is two samples away from the current sample. At 32 kHz, such a $30^{th}$-order sparse LPC predictor will perform prediction over a time span normally covered by a $60^{th}$-order LPC predictor that predicts the current sample as the weighted sum of all the previous samples but with significantly less complexity.

It is noted that, in alternate embodiments, short-term prediction techniques other than LPC prediction may be used to compute a short-term prediction error. For example, in an embodiment, simple linear interpolation may be used to perform short-term prediction to reduce complexity. Still other techniques may be used.

The LPC prediction error calculated by logic block 1308 is passed to logic block 1310. Logic block 1310 performs so-called pitch prediction analysis (also referred to as a long-term prediction analysis) on the LPC prediction error to determine the coefficients of a pitch predictor. Logic block 1310 uses the pitch predictor to compute a pitch prediction error, which may also be referred to as the long-term prediction error or long-term prediction residual. In particular, for each sample in the LPC prediction error, logic block 1310 subtracts the predicted value of the sample obtained using the pitch predictor from the actual value of the sample to obtain a sample of the pitch prediction error. The foregoing operations are intended to produce a representation of the L+R signal from which both the short-term and long-term redundancies of the audio signal have been removed.

In an embodiment, determining the coefficients of the pitch predictor include estimating a pitch period or lag and then deriving one or more pitch predictor taps. As will be appreciated by persons skilled in the relevant art(s), a well-known normalized cross-correlation function may be used to estimate the pitch period. In an alternate embodiment, a simple pitch extraction algorithm based on the average magnitude difference function (AMDF) is used. One example of such a pitch extraction algorithm is described in commonly-owned, co-pending U.S. patent application Ser. No. 12/147,781 to Chen, entitled "Low Complexity Frame Erasure Concealment" and filed on Jun. 27, 2008, the entirety of which is incorporated by reference herein.

In a particular implementation, a single pitch predictor tap is used. It has been observed that using a single pitch predictor tap on a 32 kHz signal will produce satisfactory results while providing reduced complexity.

Once the pitch prediction error has been computed by logic block 1310, it is provided to logic block 1316 to initiate matching against a plurality of noise pulse templates 1312. Various examples of noise pulse templates 1312 and a description of how such templates may be derived were previously provided. In one embodiment, six "single-pulse" and five "double-pulse" noise pulse templates are used.

Because the matching to be performed by logic block 1316 is performed against the pitch prediction error generated by logic block 1310 rather than the original frame of the L+R signal, noise pulse templates 1312 are first convolved with the impulse response of the LPC prediction error filter used by logic block 1308 to calculate the LPC prediction error. This operation, which is performed by logic block 1314, generates representations of the noise pulse templates in the same domain as the LPC prediction error, which is necessary for subsequent matching operations. It should be noted that in the embodiment shown in FIG. 13, the noise pulse templates are not convolved with the impulse response of the pitch prediction error filter because the minimum pitch period is longer than the duration of the noise pulse templates.

Logic block 1316 operates to find a best-matching convolved noise pulse template for every sample in the pitch prediction error received from logic block 1310. In one embodiment, logic block 1316 performs this function by, for each sample in the pitch prediction error produced by logic block 1310: generating a comparison waveform, comparing the generated comparison waveform with each convolved noise pulse template to determine a measure of dissimilarity or similarity associated with each convolved noise pulse, and identifying the convolved noise pulse template that provides the smallest measure of dissimilarity or the greatest measure of similarity.

In one embodiment, generating a comparison waveform for a particular sample in the pitch prediction error comprises: identifying a prediction error waveform that comprises the two samples that precede the sample, the current sample, and the six samples that follow the sample and applying offset-removal and normalization to the prediction error waveform in the same manner as was used to generate the noise pulse templates (as described above). Since offset-removal is applied, the zero end points can be removed from the processed prediction error waveform, resulting in a seven-sample comparison waveform that can be used for matching against the seven-sample convolved noise pulse templates.

In one embodiment, the convolved noise pulse template that provides the smallest measure of dissimilarity is identified for each sample in the pitch prediction error by calculating a sum of magnitude differences (SMD) between each comparison waveform and each convolved noise pulse template and then selecting the convolved noise pulse template that provides the smallest SMD.

Once logic block 1316 has found the best-matching convolved noise pulse template for each sample in the pitch prediction error, logic block 1318 performs threshold testing to identify preliminary noise pulse candidates. In one embodiment, logic block 1318 performs this function by determining, for each sample in the pitch prediction error, if the measure of dissimilarity associated with the best-matching convolved noise pulse is less than a predetermined threshold or if the measure of similarity associated with the best-matching convolved noise pulse is greater than a predetermined threshold. Samples for which a best-matching convolved noise template is found that satisfy the threshold testing are then used to identify the location of preliminary noise pulse candidates in the L+R signal domain.

In one embodiment, a signal comprising the smallest measure of dissimilarity (e.g., SMD) for each sample in the pitch prediction error is manipulated prior to performing threshold testing in order to better identify preliminary noise pulse candidates. For example, the signal comprising the smallest measure of dissimilarity for each sample in the pitch prediction error may be inverted to facilitate the application of peak detection techniques for identifying preliminary noise pulse candidates. Such inversion may involve, for example, normalizing the signal by the pulse magnitude, inverting the normalized signal, range-bounding the inverted signal and then scaling the inverted signal back up using the original signal level. Additionally, a peak enhancement technique may be applied to the inverted signal that entails subtracting the value of a sample that occurs two samples after a peak from value of the peak sample. This technique is premised on the observation that when the inverted signal has a positive peak signifying the location of a noise pulse, it will often be followed by a negative peak two samples later. It is noted that in an embodiment that uses such a "two-sample differential" peak enhancement technique, the convolved noise pulse template matching is applied starting with the last sample of the pitch prediction error and working backwards to the first sample. Still other signal processing techniques may be used to identify preliminary noise pulse candidates.

Logic block 1320 performs operations to confirm that the preliminary noise pulse candidates identified in the L+R signal domain by logic block 1318 actually match a corresponding noise pulse template. For example, logic block 1320 may calculate a measure of dissimilarity between a preliminary noise pulse candidate and a corresponding noise pulse template in the L+R signal domain and then determine if the measure of dissimilarity is less than a predefined threshold. Alternatively, logic block 1320 may calculate a measure of similarity between a preliminary noise pulse candidate and a corresponding noise pulse template in the L+R signal domain and then determine if the measure of similarity exceeds a predefined threshold.

In one embodiment, logic block 1320 confirms that a preliminary noise pulse candidate identified in the L+R signal domain actually matches a corresponding noise pulse template by generating a plurality of matching sub-vectors for the corresponding noise pulse template, calculating a measure of dissimilarity or measure of similarity for each sub-vector, summing the measure of dissimilarity or measure of similarity across all sub-vectors, and then comparing the total with a threshold to determined if the total measure of dissimilarity is less than a predefined threshold or if the total measure of similarity is greater than a predefined threshold. For example, in an embodiment in which each noise pulse template comprises seven samples represented by the vector of time indices $[1, 2, 3, 4, 5, 6, 7]$, a measure of distortion or similarity may be determined for each of the following seven sub-vectors of the noise pulse template: $[1,2,3,4]$, $[2,3,4,5]$, $[1,2,3,4,5]$, $[2,3,4,5,6]$, $[1,2,3,4,5,6]$, $[2,3,4,5,6,7]$ and $[1,2,3,4,5,6,7]$. The measures of distortion or similarity may then be summed across all seven sub-vectors and the total may be compared with a threshold to determine if the preliminary noise pulse candidate is actually a noise pulse. Such a sub-vector-based matching approach can be used to ensure that a preliminary noise pulse candidate closely matches a noise pulse template before removing it.

If logic block 1320 confirms that a preliminary noise pulse candidate actually matches a corresponding noise pulse template, then logic block 1322 subtracts a properly scaled version of the corresponding noise pulse template from the appropriate location in the current frame of the L+R signal. To ensure that the noise pulse is also not propagated forward by the pitch predictor used by logic block 1310, logic block 1322 subtracts the convolved version of the corresponding noise pulse template from the LPC prediction error produced by logic block 1108.

Some noise pulses may be overlapping. As noted above, in accordance with one embodiment, noise pulse templates 1312 includes a number of "double-pulse" noise pulse templates that are used to detect and remove overlapping noise pulses in the case where a second noise pulse lags a first noise pulse by only one or two samples in the 32 kHz domain. In further accordance with such an embodiment, it was observed that "single-pulse" noise pulse templates were sufficient to detect and remove overlapping noise pulses in the case where a second noise pulse lags a first noise pulse by five or more samples in the 32 kHz domain.

Logic block 1324 is included to address a scenario in which a second noise pulse lags a first noise pulse by three or four samples in the 32 kHz domain. In accordance with such a scenario, it is to be expected that the operations of the aforementioned components shown in FIG. 13 will be sufficient to detect and remove the second noise pulse, as the second noise pulse will have a shape that is very similar to one of the "single-pulse" noise pulse templates. However, such operations will not be sufficient to detect and remove the first noise pulse, as the first noise pulse will not have such a shape until the second noise pulse is removed by logic block 1320. Therefore, after a noise pulse is removed from the current frame of the L+R signal by logic block 1320, logic block 1324 will perform a search for noise pulses occurring 3 or 4 samples before the location of the removed noise pulse. If logic block 1324 detects noise pulses at those locations, it will remove them and also invoke logic block 1322 to remove a convolved version from the LPC prediction error in a manner previously described. An alternative approach would be to perform a second-pass search over the entire frame for additional noise pulses; however, such an approach would be less efficient than focusing the search on a location that is 3 or 4 samples before the location of a removed noise pulse.

After logic block 1324 has detected and removed any additional noise pulses from the current frame of the L+R signal, it outputs the modified frame as part of the pop-suppressed L+R signal.

The embodiment of L+R pop suppression logic 306 shown in FIG. 13 may involve more complexity than is desired for a given FM receiver implementation. For example, an FM receiver may not include the necessary processing power and/or memory to perform all of the operations described above in reference to the various logic blocks of FIG. 13. To address this issue, a lower-complexity version of L+R pop suppression logic 306 may be implemented. For example, to reduce complexity, any or all of the following modifications to previously-described embodiments may be implemented: (1) an $8^{th}$ order LPC predictor may be used instead of the previously-described $30^{th}$ order LPC predictor; (2) pitch prediction may be removed entirely, such that the matching of the convolved noise pulse templates is performed directly against the LPC prediction error; (3) the multi-sub-vector search described above in reference to logic block 1320 is not performed; and (4) "double-pulse" noise pulse templates are not included in noise pulse templates 1312.

Still further, to reduce complexity, a "pre-screening" may be applied to the LPC prediction error such that only a configurable number of samples are considered for matching by logic block 1316, rather than all the samples as described above. The samples that are considered may be those having the largest magnitude (and thus being most likely to correspond to the peak of a noise pulse). In further accordance with this example, if the configurable number of samples is 10 and the LPC prediction error includes 256 samples, only those 10 samples having the largest magnitude would be considered for matching by logic block 1316 rather than all 256. The foregoing approach can significantly reduce complexity, but at the cost of slightly less robust noise pulse detection and removal.

Figure 14:
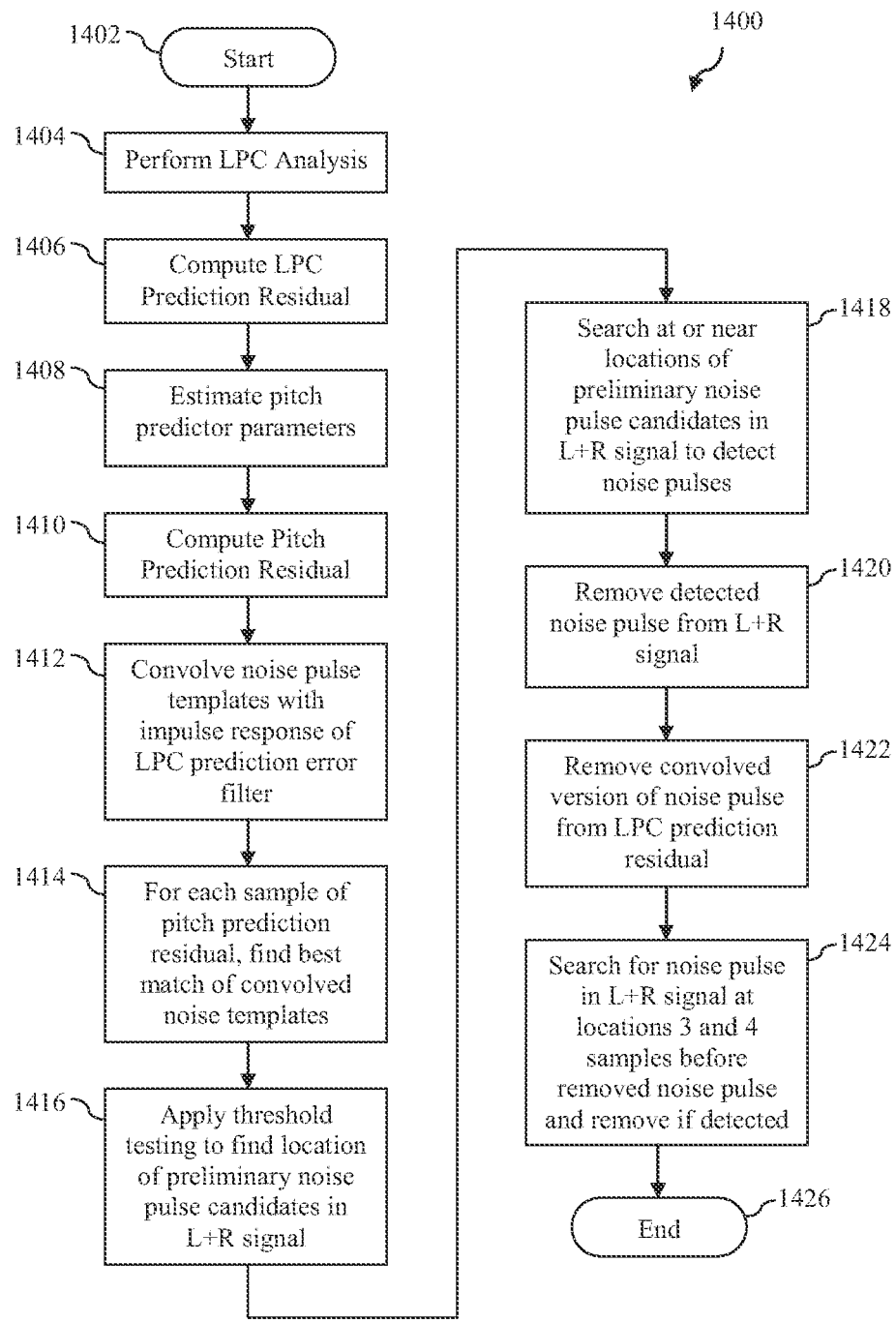
FIG. 14 depicts a flowchart of a method for performing L+R pop suppression in accordance with an embodiment.

FIG. 14 depicts a flowchart 1400 of a method for performing L+R pop suppression in accordance with an embodiment. The method of flowchart 1400 may be performed, for example, by L+R pop suppression logic 306 as described above in reference to FIGS. 3 and 13. However, the method is not limited to that implementation. The method of flowchart 1400 is applied to a frame of the L+R signal when an estimated CNR associated with that frame is determined to be below a predetermined threshold.

As shown in FIG. 14, the method of flowchart 1400 is initiated at step 1402, after which control flows to step 1404. At step 1404, an LPC analysis is performed on the current frame of L+R signal to determine the coefficients of an LPC predictor that predicts the value of each sample of the current frame as the weighted sum of a number of prior samples. This step may be performed, for example, by logic block 1306 of FIG. 13.

At step 1406, the LPC predictor obtained during step 1404 is used to compute an LPC prediction residual, which may also be referred to as the LPC prediction error or short-term prediction residual/error. In particular, for each sample in the current frame of the L+R signal, the predicted value of the sample obtained using the LPC predictor is subtracted from the actual value of the sample to obtain a sample of the LPC prediction residual.

At step 1408, a pitch predication analysis is performed on the LPC predication residual to determine the coefficients of a pitch predictor, which include an estimated pitch period.

At step 1410, the pitch predictor is used to compute a pitch prediction residual, which may also be referred to as the pitch prediction error or long-term prediction residual/error. In particular, for each sample in the LPC prediction residual, the predicted value of the sample obtained using the pitch predictor is subtracted from the actual value of the sample to obtain a sample of the pitch prediction residual.

At step 1412, each of a plurality of noise pulse templates stored in a codebook is convolved with the impulse response of the LPC prediction error filter used during step 1406 to calculate the LPC prediction residual. This operation generates representations of the noise pulse templates in the same domain as the LPC prediction residual, which is necessary for subsequent matching operations.

At step 1414, for each sample of the pitch prediction residual, a best-matching convolved noise pulse template is found. This step may comprise performing the following: generating a comparison waveform corresponding to the sample, comparing the generated comparison waveform with each convolved noise pulse template to determine a measure of dissimilarity or similarity associated with each convolved noise pulse, and identifying the convolved noise pulse template that provides the smallest measure of dissimilarity or the greatest measure of similarity.

Once the best-matching convolved noise pulse template has been found for each sample in the pitch prediction residual, threshold testing is applied to find the location of preliminary noise pulse candidates in the L+R signal as shown at step 1416. In one embodiment, this step is performed by determining, for each sample in the pitch prediction residual, if a measure of dissimilarity associated with the best-matching convolved noise pulse is less than a predetermined threshold or if a measure of similarity associated with the best-matching convolved noise pulse is greater than a predetermined threshold. Still other techniques may be used for performing this step. Samples for which a best-matching convolved noise template is found that satisfy the threshold testing are then used to identify the location of preliminary noise pulse candidates in the L+R signal domain.

At step 1418, a search is performed at or near the identified locations of the preliminary noise pulse candidates in the L+R signal to detect noise pulses. In one embodiment, a search is performed within +/−1 sample of each identified location produced by step 1416. The search may include performing matching operations to determine if waveforms located within the L+R signal match corresponding noise pulse templates.

It is to be understood that steps 1420, 1422 and 1424 are performed for each noise pulse detected in step 1418. In particular, at step 1420, a noise pulse detected during step 1418 is removed from the L+R signal. In one embodiment, this step comprises subtracting a properly-scaled version of a corresponding noise pulse template from the L+R signal. At step 1422, a convolved version of the detected noise pulse is also removed from the LPC prediction residual. This step may comprise subtracting a convolved version of the corresponding noise pulse template from the LPC prediction residual. At step 1424, a search for a noise pulse is conducted at locations 3 and 4 samples before the removed noise pulse. If a noise pulse is detected at that location it is removed in a like manner to steps 1420 and 1422.

Finally, at step 1426, the method of flowchart 1400 ends.

It is noted that the method of flowchart 1400 describes only one manner of performing L+R pop suppression. A variety of different approaches to performing L+R pop suppression may be utilized. For example, high-complexity and low-complexity approaches to performing L+R pop suppression, as well as a variety of alternative techniques for performing various steps of L+R pop suppression, were described above in reference to FIG. 13. Thus, flowchart 1400 is presented herein by way of example only and is not intended to be limiting.

4. L−R and L+R Single-Channel Noise Suppression

Figure 15:
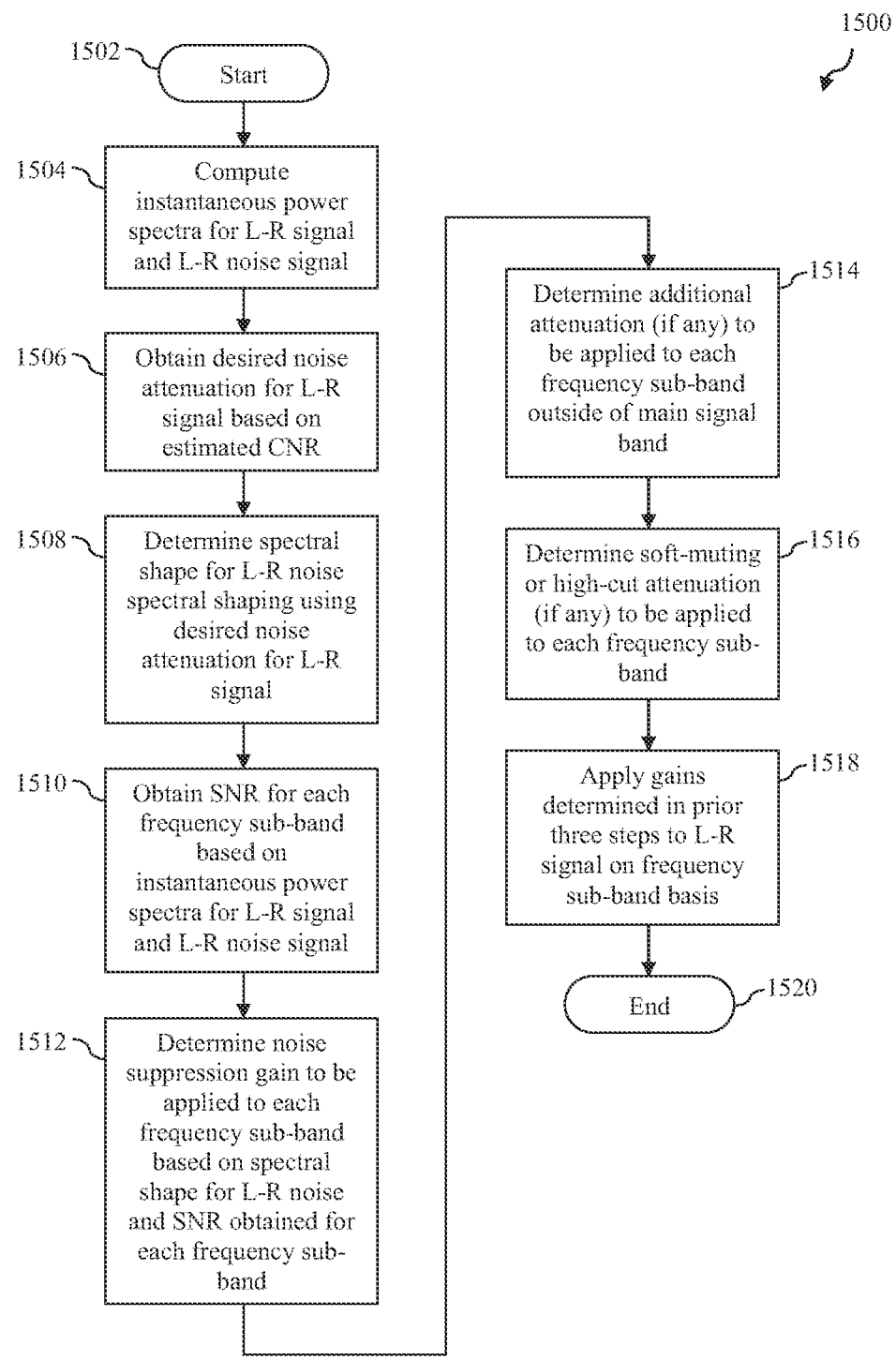
FIG. 15 depicts a flowchart of a method for applying single-channel noise suppression to an L−R signal in accordance with an embodiment.

FIG. 15 depicts a flowchart 1500 of a method for applying single-channel noise suppression to an L−R signal in accordance with an embodiment. The method of flowchart 1500 may be performed, for example, by L−R noise suppression logic 308 as described above in reference to FIG. 3. However, the method is not limited to that implementation.

The method of flowchart 1500 is applied to one frame of the L−R signal at a time. Each frame of the L−R signal is converted from the time domain to the frequency domain prior to being operated upon by the method. Furthermore, for each frame of the L−R signal to be operated upon by the method, a time-aligned frame of the quadrature-demodulated L−R noise signal is also received and converted from the time domain to the frequency domain. The conversion of these frames from the time domain to the frequency domain may be carried out, for example, by performing an FFT. In a particular embodiment, a hardware-implemented FFT accelerator is used to efficiently perform the conversion.

As shown in FIG. 15, the method of flowchart 1500 is initiated at step 1502, after which control flows to step 1504. At step 1504, instantaneous power spectra are obtained for the current frame of the L−R signal and the L−R noise signal. In one embodiment, the instantaneous power spectrum for the current frame of the L−R signal is obtained by squaring the magnitude of each frequency component included in the frequency domain representation thereof. A similar approach may be used to obtain the instantaneous power spectrum for current frame of the L−R noise signal.

At step 1506, a desired noise attenuation is obtained for the current frame of the L−R signal based on the estimated CNR received from CNR estimation logic 302. Generally speaking, the lower the estimated CNR, the greater the amount of desired noise attenuation that is selected. In one embodiment, this step is carried out by mapping specified estimated CNR values to corresponding noise attenuation amounts and linearly interpolating between noise attenuation amounts when the current estimated CNR falls between one of the specified estimated CNR values. However, entirely different methods may be used to obtain a desired noise attenuation for the current frame of the L−R signal based on the estimated CNR.

At step 1508, a spectral shape for L−R noise spectral shaping is determined using the desired noise attenuation for the L−R signal as determined during step 1306. The spectral shape that is selected determines how the total desired noise attenuation will be applied on a frequency sub-band by frequency sub-band basis. The manner in which a spectral shape may be used to apply noise spectral shaping in a frequency-based single-channel noise suppression system is described in the aforementioned and incorporated U.S. patent application Ser. No. 12/897,548 to Thyssen, entitled "Noise Suppression System and Method" and filed on Oct. 4, 2010. In the context of U.S. patent application Ser. No. 12/897,548, the spectral shape for noise spectral shaping is represented as frequency-dependent noise attenuation factor $H_s(f)$. As described in U.S. patent application Ser. No. 12/897,548, if the frequency-dependent noise attenuation factor $H_s(f)$ is the same across all frequency sub-bands, then this will be the same as applying a flat attenuation to the noise signal (i.e., there will be no shaping of the noise signal), whereas if the noise attenuation factor varies from frequency sub-band to frequency sub-band, then arbitrary noise shaping can be achieved.

At step 1510, an SNR is obtained for each frequency sub-band based on the instantaneous power spectra for the current frame of the L−R signal and the current frame of the L−R noise signal.

In one embodiment, step 1510 comprises obtaining a smoothed SNR for each frequency sub-band. SNR smoothing may be used to avoid introducing excessive fluctuation into the L−R signal through application of noise suppression, as the amount of noise suppression gain applied to each frequency sub-band is driven in part by the estimated SNR for that frequency sub-band.

In a particular embodiment, obtaining the smoothed SNR for each frequency sub-band comprises: (1) updating a smoothed L−R noise power for each frequency sub-band based on the current instantaneous L−R noise power for each frequency sub-band; (2) obtaining an instantaneous SNR for each frequency sub-band by dividing the instantaneous L−R signal power for each frequency sub-band by the smoothed L−R noise power for the corresponding frequency sub-band; and (3) updating a smoothed SNR for each frequency sub-band based on the instantaneous SNR for each frequency sub-band.

In further accordance with such an embodiment, the step of updating the smoothed L−R noise power for each frequency sub-band based on the current instantaneous L−R noise power for each frequency sub-band may be performed by applying exponential averaging. For example, the smoothed L−R noise power for a given frequency sub-band may be updated in accordance with $$Plmrn_{sm} = AF_{LMRN} * Plmrn_{sm} + (1 - AF_{LMRN}) * Plmrn, \quad \text{(Eq. 1)}$$

wherein $Plmrn_{sm}$ is the smoothed L−R noise power for the given frequency sub-band, Plmrn is the instantaneous L−R noise power for the given frequency sub-band, and $AF_{LMRN}$ is the exponential attenuation factor for smoothing the L−R noise power. In a like manner, the step of updating the smoothed SNR for each frequency sub-band may be performed by applying exponential averaging. For example, the smoothed SNR for a given frequency sub-band may be updated in accordance with $$Snrlmr_{sm} = AF_{LMR} * Snrlmr_{sm} + (1 - AF_{LMR}) * Snrlmr, \quad \text{(Eq. 2)}$$

wherein $Snrlmr_{sm}$ is the smoothed SNR for the given frequency sub-band, Snrlmr is the instantaneous SNR for the given frequency sub-band, and $AF_{LMR}$ is the exponential attenuation factor for smoothing the SNR.

In an embodiment that utilizes an attenuation factor for smoothing the SNR that is close to 1, it was observed that a long period of time was required (e.g., more than 100 8-ms frames) to achieve the desired level of SNR smoothing after system reset or FM station change. During this time period, the output audio quality suffers. In order to more rapidly achieve the desired level of SNR smoothing, one embodiment performs rectangular averaging of the SNR over a predetermined number of frames following a system reset or FM station change and then switches to performing exponential averaging after processing the predetermined number of frames. For example, in one particular embodiment, no smoothing is performed for the first frame after system reset or FM station change, then from frame 2 to frame 20, the smoothed L–R noise power for a given frequency sub-band is updated in accordance with $$Plmrn_{sm} = ((k-1)*Plmrn_{sm} + Plmrn)/k, \quad \text{(Eq. 3)}$$

wherein k is the frame number, and the smoothed SNR for a given frequency sub-band is updated in accordance with $$Snrlmr_{sm} = ((k-1)*Snrlmr_{sm} + Snrlmr)/k. \quad \text{(Eq. 4)}$$

It can be shown that Equations 3 and 4 are equivalent to averaging with a rectangular window from the first frame to the k-th frame, but they have the advantages of having the same forms of Equations 1 and 2 and also eliminating the need to store Plmrn and Snrlmr from the (k−1)-th frame all the way back to the first frame. After the $20^{th}$ frame, exponential averaging is then used to calculate the smoothed L–R noise power and the smoothed SNR for each frequency sub-band using Equations 1 and 2 as set forth above. Such an embodiment can achieve adequate smoothing of the SNR within the first 20 frames after system reset or FM station change. Furthermore, muting may be applied to the output audio signal during the first 20 frames in order to avoid generating poor quality audio output during that time period.

As noted above, SNR smoothing may be used to avoid introducing excessive fluctuation into the L–R signal through application of noise suppression. However, there are instances where excessive SNR smoothing may cause an active portion of the L–R signal to be suppressed. Generally speaking, this may occur because, although the instantaneous SNR of the L–R signal may increase rapidly during the active portion of the L–R signal, the corresponding smoothed SNR will not increase quickly enough to generate a significant increase in the noise suppression gain. To address this issue, a further embodiment substitutes the instantaneous SNR for the smoothed SNR in any frequency sub-band where the L–R signal is deemed to be active or where the L–R signal is not currently active but was deemed to be active in the preceding frame. For example, this may be implemented by substituting the instantaneous SNR for the smoothed SNR in any frequency sub-band where the instantaneous SNR for the current frame exceeds a predetermined threshold (e.g., 20) or where the instantaneous SNR for the current frame does not exceed the predetermined threshold but the instantaneous SNR for the previous frame did exceed the predetermined threshold.

Once an SNR has been obtained for each frequency sub-band, a noise suppression gain to be applied to each frequency sub-band is determined in step 1512 based on the obtained SNRs and the spectral shape for L–R noise determined in step 1508. In one embodiment, the noise suppression gain for a given frequency sub-band is determined in accordance with $$H_{lmr} = \frac{\alpha_{LMR} * SNR_{apriori\_lmr} + (1 - \alpha_{LMR}) * Hs_{lmr}}{\alpha_{LMR} * SNR_{apriori\_lmr} + (1 - \alpha_{LMR})}, \quad \text{(Eq. 5)}$$

wherein $H_{lmr}$ is the noise suppression gain for the given frequency sub-band, $SNR_{apriori\_lmr}$ is the a priori SNR in the linear domain for the given frequency sub-band, which is obtained by subtracting 1 from the a posteriori SNR in the linear domain calculated in Equations 2 and 4 and then lower-bounding it by a small positive number, $\alpha_{LMR}$ is a parameter that specified a degree of balance between distortion of the desired L–R signal and unnaturalness of a residual noise signal included in the noise-suppressed L–R signal, and $Hs_{lmr}$ represents a frequency-dependent noise attenuation factor that is used to implement the selected spectral shape for L–R noise. The foregoing technique for determining a noise suppression gain for a given frequency sub-band is further described in the aforementioned and incorporated U.S. patent application Ser. No. 12/897,548 to Thyssen, entitled "Noise Suppression System and Method" and filed on Oct. 4, 2010.

Once the noise suppression gains have been determined in step 1512 they may be applied to the corresponding frequency sub-bands of the current frame of the L–R signal to generate a frame of the noise-suppressed L–R signal. However, in the embodiment shown in FIG. 15, additional processing steps are performed to further improve the audio quality of the noise-suppressed L–R signal.

In particular, as shown at step 1514, a determination is made as to whether additional attenuation should be applied to each frequency sub-band outside of a "main signal band" for the current L–R frame. It may be deemed desirable to perform this step in an embodiment in which the desired noise attenuation amounts are conservatively tuned so as to avoid introducing excessive distortion into the L–R signal. It was observed that when less aggressive noise attenuation amounts were applied, noise could still be heard in the upper frequency sub-bands of noise-suppressed L–R signal. Thus, this step is intended to apply additional attenuation to such frequency sub-bands.

In one embodiment, determining the "main signal band" comprises detecting the highest frequency sub-band in which the instantaneous SNR is above a certain threshold, and treating that frequency sub-band and every frequency sub-band below that frequency sub-band as the main signal band. In another embodiment, determining the "main signal band" may comprise detecting the lowest and highest frequency sub-bands in which the instantaneous SNR is above a certain threshold, and treating those frequency sub-bands and every frequency sub-band in between as the main signal band. Still other methods may be used to determine which frequency sub-bands are deemed to be within the main signal band.

In one embodiment, the amount of additional attenuation to be applied outside of the main signal band is selected based on the estimated CNR for the current L–R signal frame. Generally speaking, the lower the estimated CNR, the greater the amount of additional attenuation that is selected. In one embodiment, this step is carried out by mapping specified estimated CNR values to corresponding additional attenuation amounts and linearly interpolating between additional attenuation amounts when the current estimated CNR falls between one of the specified estimated CNR values. However, entirely different methods may be used to obtain an additional attenuation amount to be applied to frequency sub-bands outside of the main signal band based on the estimated CNR.

In step 1516, it is determined if soft-muting or high-cut attenuation is to be applied to each frequency sub-band. Generally speaking, soft-muting involves applying an equal amount of additional attenuation to all frequency sub-bands at very low CNRs, when the audio quality is expected to be very poor. In one embodiment, soft-muting is only applied when the estimated CNR drops below a predetermined threshold (e.g., 8 dB). In further accordance with such an embodiment, the amount of soft-muting attenuation to be applied may increase as a function of decreasing estimated CNR. For example, the amount of soft-muting attenuation to be applied may increase as the estimated CNR drops from 8 dB to 0 dB.

High-cut attenuation generally refers to applying attenuation to a predetermined number of the highest-frequency sub-bands to remove hissing from the L−R signal at very low CNRs. In one embodiment, high-cut attenuation is only applied when the estimated CNR drops below a predetermined threshold (e.g., 8 dB). In further accordance with such an embodiment, the index of the lowest frequency sub-band to which high-cut attenuation will be applied may decrease as a function of decreasing estimated CNR. For example, the index of the lowest frequency sub-band to which high-cut attenuation will be applied may decrease as the estimated CNR drops from 8 dB to 0 dB. High-cut attenuation may involve applying a zero gain to the identified lowest frequency sub-band and every frequency sub-band having an index greater than the identified lowest frequency sub-band. Alternatively, high-cut attenuation may involve applying an amount of attenuation that increases as the index of the frequency sub-bands to which such attenuation is applied increases.

At step 1518 the gains to be applied to the various frequency sub-bands of the current frame of the L−R signal during steps 1512, 1514 and 1516 are combined and applied to the current frame of the L−R signal on a frequency sub-band by frequency sub-band basis. This step may involve generating a gain mask to be applied to the frequency domain representation of the current frame of the L−R signal. In accordance with certain embodiments, any of the gains determined during steps 1512, 1514 and 1516 or any gains obtained by combining such gains may be smoothed prior to application to the current frame of the L−R signal.

Finally, at step 1520, the method of flowchart 1500 ends. The method produces a frequency domain representation of the noise-suppressed current frame of the L−R signal. This frequency domain representation may be converted back into the time domain. This may be carried out, for example, by performing an inverse FFT (IFFT).

Figure 16:
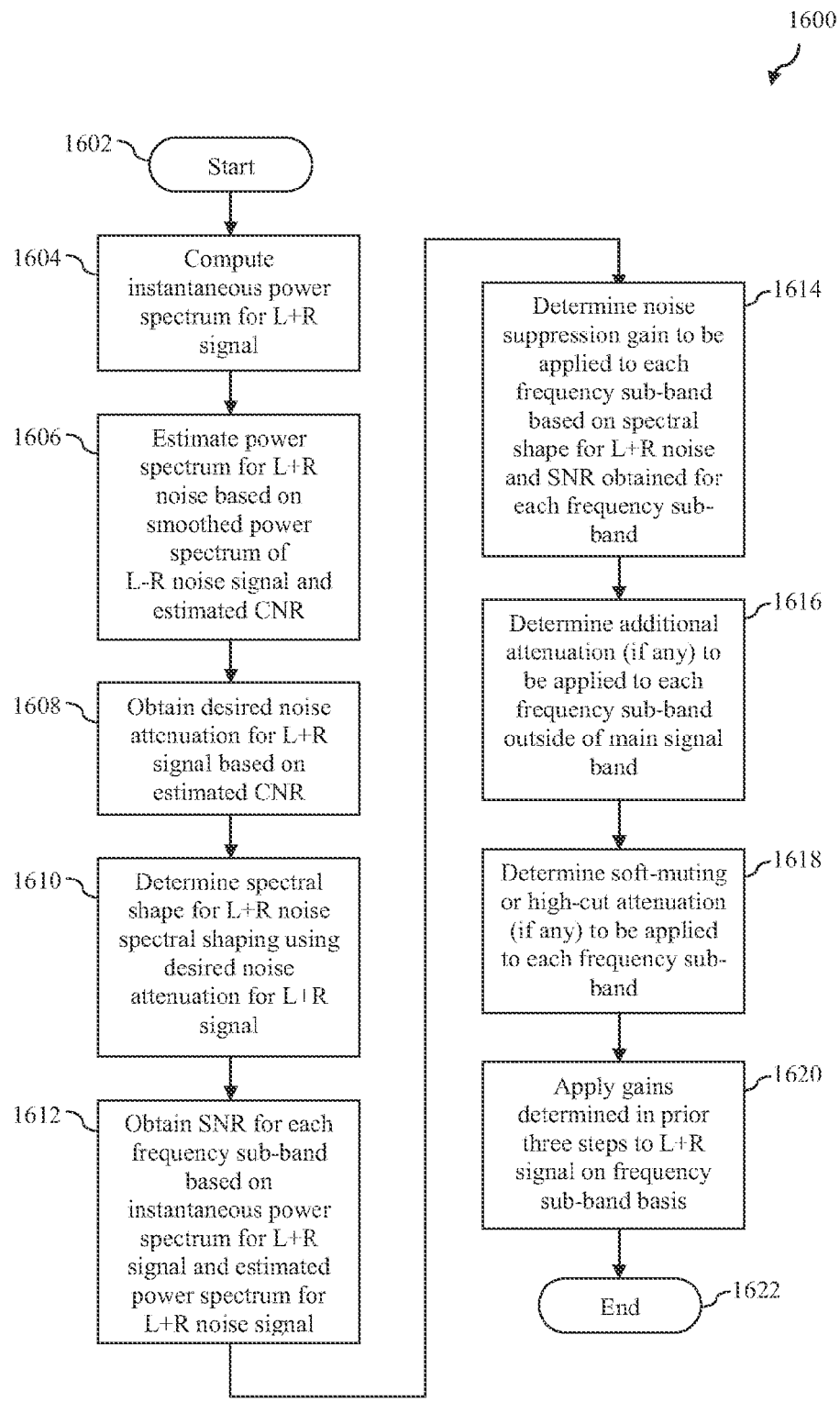
FIG. 16 depicts a flowchart of a method for applying single-channel noise suppression to an L+R signal in accordance with an embodiment.

FIG. 16 depicts a flowchart 1600 of a method for applying single-channel noise suppression to an L+R signal in accordance with an embodiment. The method of flowchart 1600 may be performed, for example, by L+R noise suppression logic 310 as described above in reference to FIG. 3. However, the method is not limited to that implementation.

The method of flowchart 1600 will be described as being performed on an L+R signal. However, in an embodiment in which the method of flowchart 1600 is performed by L+R noise suppression logic 310, the method is actually applied to the pop-suppressed L+R signal produced by L+R pop suppression logic 306. Thus, in the context of the following description of the method of flowchart 1600, references to "the L+R signal" should be understood to encompass both a pop-suppressed L+R signal as well as an L+R signal to which pop-suppression has not been applied.

The method of flowchart 1600 is performed on one frame of the L+R signal at a time. Each frame of L+R signal is converted from the time domain to the frequency domain prior to being operated upon by the method. The conversion of the frame from the time domain to the frequency domain may be carried out, for example, by performing an FFT. In a particular embodiment, a hardware-implemented FFT accelerator is used to efficiently perform the conversion.

As shown in FIG. 16, the method of flowchart 1600 is initiated at step 1602, after which control flows to step 1604. At step 1604, an instantaneous power spectrum is obtained for the current frame of the L+R signal. In one embodiment, the instantaneous power spectrum for the current frame of the L+R signal is obtained by squaring the magnitude of each frequency component included in the frequency domain representation thereof.

At step 1606, a power spectrum for the L+R noise is estimated based on a smoothed power spectrum of the L−R noise signal and the estimated CNR for the current frame. The smoothed power spectrum of the L−R noise may be obtained in accordance with techniques described above in reference to step 1510 of flowchart 1500 and thus will not be repeated here for the sake of brevity. The estimated CNR for the current frame is received from CNR estimation logic 302.

Generally speaking, step 1606 is carried out by subtracting in the logarithmic domain a noise difference from the smoothed L−R noise power in each frequency sub-band to generate an estimated L+R noise power in each frequency sub-band. Because the power spectrum of the L−R noise and the power spectrum of the L+R noise have an observable relationship based both on frequency and CNR, the amount of noise difference to be subtracted for a given frequency sub-band and given estimated CNR can be determined empirically and stored in a look-up table which can then be used to perform this step. In one embodiment, the look-up table includes noise differences for only a subset of all possible combinations of frequency sub-bands/estimated CNRs and linear interpolation between table entries is used to derive noise differences for other combinations.

At step 1608, a desired noise attenuation is obtained for the current frame of the L+R signal based on the estimated CNR received from CNR estimation logic 302. Generally speaking, the lower the estimated CNR, the greater the amount of desired noise attenuation that is selected. In one embodiment, this step is carried out by mapping specified estimated CNR values to corresponding noise attenuation amounts and linearly interpolating between noise attenuation amounts when the current estimated CNR falls between one of the specified estimated CNR values. However, entirely different methods may be used to obtain a desired noise attenuation for the current frame of the L+R signal based on the estimated CNR.

At step 1610, a spectral shape for L+R noise spectral shaping is determined using the desired noise attenuation for the L+R signal as determined during step 1608. The spectral shape that is selected determines how the total desired noise attenuation will be applied on a frequency sub-band by frequency sub-band basis.

At step 1612, an SNR is obtained for each frequency sub-band based on the instantaneous power spectrum for the current frame of the L+R signal and the estimated power spectrum for the L+R noise signal.

In one embodiment, step 1612 comprises obtaining a smoothed SNR for each frequency sub-band by (1) obtaining an instantaneous SNR for each frequency sub-band by dividing the instantaneous L+R signal power for each frequency sub-band by the estimated L+R noise power for the corresponding frequency sub-band; and (2) updating a smoothed SNR for each frequency sub-band based on the instantaneous SNR for each frequency sub-band.

In further accordance with such an embodiment, the step of updating the smoothed SNR for each frequency sub-band may be performed by applying exponential averaging. For example, the smoothed SNR for a given frequency sub-band may be updated in accordance with $$Snrlpr_{sm} = AF_{LPR} * Snrlpr_{sm} + (1 - AF_{LPR}) * Snrlpr, \quad \text{(Eq. 6)}$$

wherein $Snrlpr_{sm}$ is the smoothed SNR for the given frequency sub-band, $Snrlpr$ is the instantaneous SNR for the given frequency sub-band, and $AF_{LPR}$ is the exponential attenuation factor for smoothing the SNR.

In an embodiment that utilizes an attenuation factor for smoothing the SNR that is close to 1, it was observed that a long period of time was required (e.g., more than 100 8-ms frames) to achieve the desired level of SNR smoothing after system reset or FM station change. During this time period, the output audio quality suffers. In order to more rapidly achieve the desired level of SNR smoothing, one embodiment performs rectangular averaging of the SNR over a predetermined number of frames following a system reset or FM station change and then switches to performing exponential averaging after processing the predetermined number of frames. For example, in one particular embodiment, no smoothing is performed for the first frame after system reset or FM station change, then from frame 2 to frame 20, the smoothed SNR for a given frequency sub-band is updated in accordance with $$Snrlpr_{sm} = ((k-1)*Snrlpr_{sm} + Snrlpr)/k, \quad (Eq. 7)$$

wherein k is the frame number. After the $20^{th}$ frame, exponential averaging is then used to calculate the smoothed SNR for each frequency sub-band using Equation 6 as set forth above. Such an embodiment can achieve adequate smoothing of the SNR within the first 20 frames after system reset or FM station change. Furthermore, muting may be applied to the output audio signal during the first 20 frames in order to avoid generating poor quality audio output during that time period.

As noted above, SNR smoothing may be used to avoid introducing excessive fluctuation into the L+R signal through application of noise suppression. However, there are instances where excessive SNR smoothing may cause an active portion of the L+R signal to be suppressed. To address this issue, a further embodiment substitutes the instantaneous SNR for the smoothed SNR in any frequency sub-band where the L+R signal is deemed to be active or where the L+R signal is not currently active but was deemed to be active in the preceding frame. For example, this may be implemented by substituting the instantaneous SNR for the smoothed SNR in any frequency sub-band where the instantaneous SNR for the current frame exceeds a predetermined threshold (e.g., 30) or where the instantaneous SNR for the current frame does not exceed the predetermined threshold but the instantaneous SNR for the previous frame did exceed the predetermined threshold.

Once an SNR has been obtained for each frequency sub-band, a noise suppression gain to be applied to each frequency sub-band is determined in step 1614 based on the obtained SNRs and the spectral shape for L+R noise determined in step 1610. In one embodiment, the noise suppression gain for a given frequency sub-band is determined in accordance with $$H_{lpr} = \frac{\alpha_{LPR} * SNR_{apriori\_lpr} + (1 - \alpha_{LPR}) * Hs_{lpr}}{\alpha_{LPR} * SNR_{apriori\_lpr} + (1 - \alpha_{LPR})}, \quad (Eq. 8)$$

wherein $H_{lpr}$ is the noise suppression gain for the given frequency sub-band, $SNR_{apriori\_lpr}$ is the a priori SNR in the linear domain for the given frequency sub-band, which is obtained by subtracting 1 from the a posteriori SNR in the linear domain calculated in Equations 6 and 7 and then lower-bounding it by a small positive number, $\alpha_{LPR}$ is a parameter that specified a degree of balance between distortion of the desired L+R signal and unnaturalness of a residual noise signal included in the noise-suppressed L+R signal, and $Hs_{lpr}$ represents a frequency-dependent noise attenuation factor that is used to implement the selected spectral shape for L+R noise.

Once the noise suppression gains have been determined in step 1614 they may be applied to the corresponding frequency sub-bands of the current frame of the L+R signal to generate a frame of the noise-suppressed L+R signal. However, in the embodiment shown in FIG. 16, additional processing steps are performed to further improve the audio quality of the noise-suppressed L+R signal.

In particular, as shown at step 1616, a determination is made as to whether additional attenuation should be applied to each frequency sub-band outside of a "main signal band" for the current L−R frame. In one embodiment, determining the "main signal band" comprises detecting the highest frequency sub-band in which the instantaneous SNR is above a certain threshold, and treating that frequency sub-band and every frequency sub-band below that frequency sub-band as the main signal band. In another embodiment, determining the "main signal band" may comprise detecting the lowest and highest frequency sub-bands in which the instantaneous SNR is above a certain threshold, and treating those frequency sub-bands and every frequency sub-band in between as the main signal band. Still other methods may be used to determine which frequency sub-bands are deemed to be within the main signal band.

In one embodiment, the amount of additional attenuation to be applied outside of the main signal band is selected based on the estimated CNR for the current L+R signal frame. Generally speaking, the lower the estimated CNR, the greater the amount of additional attenuation that is selected. In one embodiment, this step is carried out by mapping specified estimated CNR values to corresponding additional attenuation amounts and linearly interpolating between additional attenuation amounts when the current estimated CNR falls between one of the specified estimated CNR values. However, entirely different methods may be used to obtain an additional attenuation amount to be applied to frequency sub-bands outside of the main signal band based on the estimated CNR.

In step 1618, it is determined if soft-muting or high-cut attenuation is to be applied to each frequency sub-band. Methods by which soft-muting and/or high-cut attenuation may be applied were described above in reference to step 1516 of flowchart 1500, and thus will not be repeated here for the sake of brevity.

At step 1620, the gains to be applied to the various frequency sub-bands of the current frame of the L+R signal during steps 1614, 1616 and 1618 are combined and applied to the current frame of the L+R signal on a frequency sub-band by frequency sub-band basis. This step may involve generating a gain mask to be applied to the frequency domain representation of the current frame of the L+R signal. In accordance with certain embodiments, any of the gains determined during steps 1614, 1616 and 1618 or any gains obtained by combining such gains may be smoothed prior to application to the current frame of the L+R signal.

Finally, at step 1622, the method of flowchart 1600 ends. The method produces a frequency domain representation of the noise-suppressed current frame of the L+R signal. This frequency domain representation may be converted back into the time domain. This may be carried out, for example, by performing an inverse FFT (IFFT).

5. L−R and L+R Fast Fading Compensation

Figure 17:
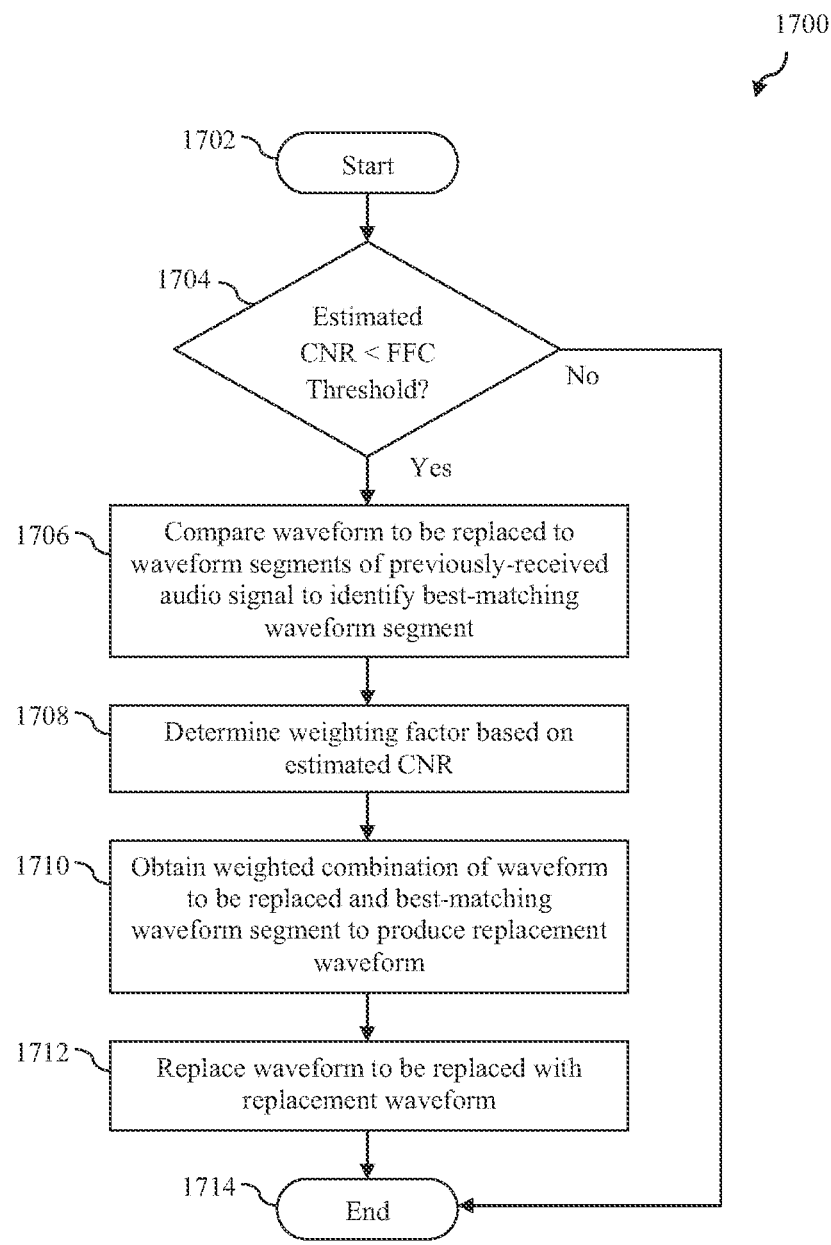
FIG. 17 depicts a flowchart of a method for applying fast fading compensation to an L−R signal or an L+R signal in accordance with an embodiment.

FIG. 17 depicts a flowchart 1700 of a method for applying fast fading compensation to an L−R signal or an L+R signal in accordance with an embodiment. The method of flowchart 1700 may be performed, for example, by L–R fast fading compensation logic 312 as described above in reference to FIG. 3, in which case the method is applied to the noise-suppressed L–R signal produced by L–R noise suppression logic 308. The method of flowchart 1700 may also be performed by L+R fast fading compensation logic 314 as described above in reference to FIG. 3, in which case the method is applied to the noise-suppressed L+R signal produced by L+R noise suppression logic 310. However, the method is not limited to those implementations. For example, in accordance with certain alternate implementations, the method may be applied directly to the original L–R signal produced by FM stereo decoder 202, the original L+R signal produced by FM stereo decoder 202, or the pop-suppressed L+R signal produced by L+R pop suppression logic 306.

Generally speaking, the fast fading compensation method described in flowchart 1700 applies a novel form of waveform extrapolation to generate concealment waveforms that are used to replace segments of the L–R and L+R signals that have been impacted by fast fading. As previously noted herein, "fast fading" refers to rapid drops in the CNR of the input FM radio signal to very low levels (e.g., below 4 dB). Such rapid drops may occur frequently, for example, when an FM radio listener drives through a series of "fading regions" in which the FM radio signal is subject to multipath distortion or blocking. Fast fading can result in as many as 5 to 10 CNR dips per second, which severely impairs audio quality.

Embodiments described herein are premised on the recognition that if the segments of the L–R and L+R signals affected by fast fading are sufficiently short, they may be replaced using techniques that are somewhat similar to those used to replace lost packets and erased frames that carry speech signals in telecommunication applications. However, it was determined that, due to the relatively short frame size of the L–R and L+R signals (8 ms in one embodiment), using a well-known "frame repeat" method to generate a concealment waveform would not produce satisfactory results. Rather, such an approach produces a very periodic concealment waveform that sounds "buzzy." Consequently, a concealment technique based on waveform extrapolation was instead selected.

As shown in FIG. 17, the method of flowchart 1700 is initiated at step 1702, after which control flows to decision step 1704. At decision step 1704, it is determined if the estimated CNR for the current frame exceeds a predetermined threshold for fast fading compensation ("FFC threshold"). If the estimated CNR for the current frame exceeds the FFC threshold, then fast fading compensation is not applied to the current frame of the audio signal (i.e., the current frame of the L–R or L+R signal) and processing ends as shown at step 1714. However, if the estimated CNR for the current frame does not exceed the FFC threshold, then fast fading compensation is applied in accordance with subsequent steps 1706, 1708, 1710 and 1712. The FFC threshold may comprise a configurable parameter that can be tuned to provide desired results for different implementations. In one particular embodiment, the FFC threshold is set to 4 dB.

In the case where fast fading compensation is to be applied, control flows to step 1706. During step 1706, a waveform of the audio signal that is to be replaced is compared with waveform segments of a previously-received audio signal to identify a best-matching waveform segment within the previously-received audio signal.

Figure 18:
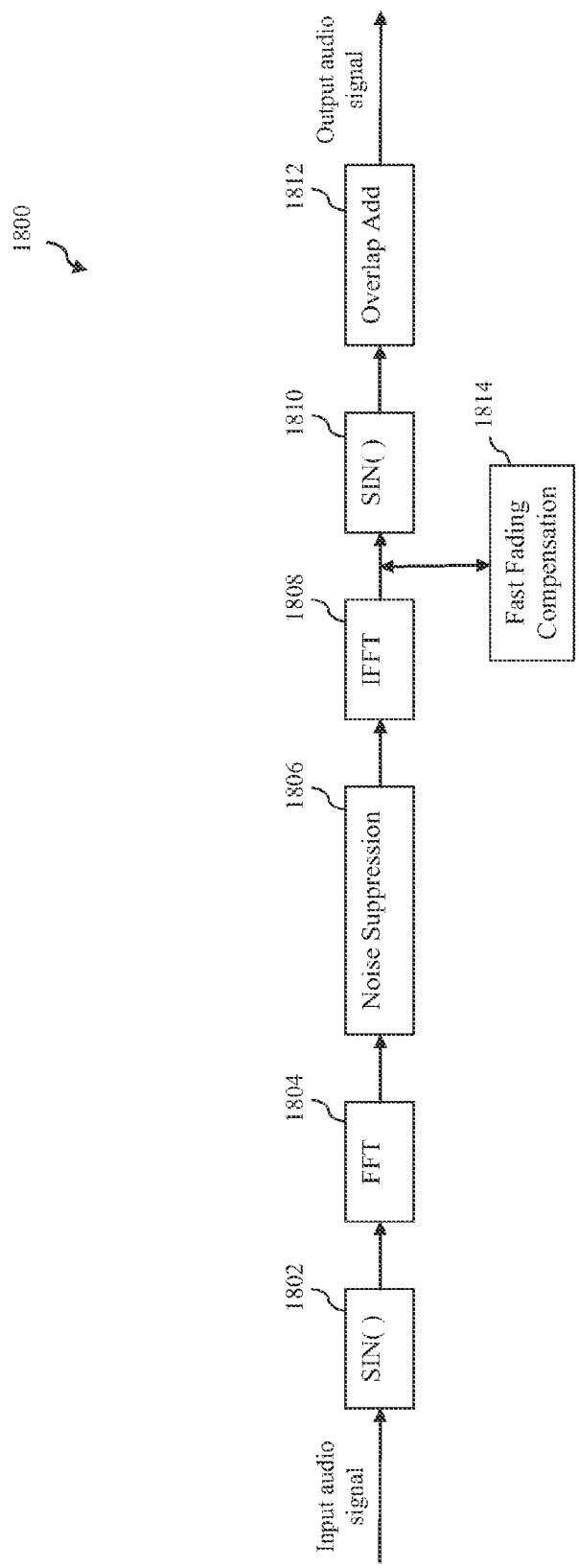
FIG. 18 is a block diagram of an exemplary system for performing signal processing operations in the frequency domain, the system including fast fading compensation logic in accordance with an embodiment.

In one embodiment, the fast fading compensation method is applied to the output of a processing block that performs an IFFT on a frequency domain representation of the audio signal. In accordance with such an embodiment, some preliminary operations must be performed in order to obtain the waveform of the audio signal that is to be replaced. For example, the fast fading compensation method may be applied in a system 1800 as shown in FIG. 18. System 1800 includes elements that are commonly used to perform audio signal processing operations in the frequency domain. In particular, as shown in FIG. 18, system 1800 includes a logic block 1802 that applies a sine window to a previously-received frame of an input audio signal and a currently-received frame of the input audio signal, wherein both frames comprise time domain signals. In an embodiment in which the frames of the audio signal are 8-ms frames, this results in a sine-windowed audio signal that is 16 ms in length. Logic block 1804 applies an FFT to the sine-windowed audio signal, thereby generating a frequency domain representation of the sine-windowed audio signal. This frequency domain representation may be operated upon by noise suppression logic 1806 (which may represent, for example, L–R noise suppression logic 308 or L+R noise suppression logic 310), thereby generating a noise-suppressed frequency domain representation of the sine-windowed audio signal. Logic block 1808 applies an IFFT to the noise-suppressed frequency domain representation of the sine-windowed audio signal, thereby generating a sine-windowed noise-suppressed audio signal. Again, in an embodiment in which the frames of the audio signal are 8-ms frames, this sine-windowed noise-suppressed audio signal will be 16 ms in length. Next, logic block 1810 applies another sine window to the sine-windowed noise suppressed audio signal to generate a sine-squared-windowed noise suppressed audio signal. Logic block 1812 overlap adds the first half of the sine-squared-windowed noise suppressed audio signal with the second half of the sine-squared-windowed noise suppressed audio signal previously output by logic block 1812 to generate a single time-domain frame of an output audio signal.

As further shown in FIG. 18, fast fading compensation logic 1814 (which may represent either of L–R fast fading compensation logic 312 or L+R fast fading compensation logic 314) may operate on frames of an audio signal as they are output by logic block 1808. Consequently, in one embodiment, fast fading compensation logic 1814 may need to operate on a 16-ms sine-windowed noise suppressed audio signal. In accordance with such an embodiment, in order to obtain the first half of the waveform to be replaced, a sine window is applied to the first half of the 16-ms sine-windowed noise suppressed audio signal and the result of that operation is overlap-added with the second half of the sine-squared-windowed noise suppressed audio signal previously output by logic block 1812. In further accordance with such an embodiment, in order to obtain the second half of the waveform to be replaced, an inverse sine window is applied to the second half of the 16-ms sine-windowed noise suppressed audio signal. Such operations will produce a "flat" time-domain waveform that can then be replaced by a replacement waveform in a manner described below.

Once the waveform to be replaced has been obtained, it is compared with time-domain waveform segments of a previously-received audio signal that is stored in a history buffer to identify a best-matching waveform segment. In one embodiment, the history buffer is 40 ms in length. In a further embodiment, the waveform to be replaced is 16 ms in length and is compared with 16-ms-long waveform segments within the previously-received audio signal. For example, in one embodiment, the 16-ms-long waveform to be replaced is compared with a 16-ms-long waveform segment obtained by "shifting backwards" at least 16 ms into the history buffer. The 16-ms-long waveform to be replaced is then compared with a waveform segment that starts a fixed number of samples before the previous 16-ms-long waveform segment, and so forth and so on.

Comparing the waveform to be replaced with each candidate waveform segment obtained from the history buffer may comprise calculating a measure of similarity between the waveform to be replaced and each candidate waveform segment, in which case the best-matching waveform segment will be the waveform segment that generates the best measure of similarity. Alternatively, comparing the waveform to be replaced with each candidate waveform segment obtained from the history buffer may comprise calculating a measure of dissimilarity between the waveform to be replaced and each candidate waveform segment, in which case the best-matching waveform segment will be the waveform segment that generates the smallest measure of dissimilarity. In further accordance with the latter embodiment, a measure of dissimilarity may be calculated by calculating a sum of magnitude differences (SMD) between the waveform to be replaced and each candidate waveform segment obtained from the history buffer.

In one embodiment, to reduce complexity, a two-stage search for the best-matching waveform segment is performed. First, a coarse search is conducted against waveform segments in the history buffer that are separated from each other by six samples and the measure of similarity or dissimilarity that is applied is applied to every six samples of the waveform to be replaced and the candidate waveform segments. This coarse search produces a preliminary best-matching waveform. Once the preliminary best-matching waveform has been found, a higher-resolution search is performed against the waveform segments immediately around the preliminary best-matching waveform to produce the final best-matching waveform.

After the best-matching waveform segment in the history buffer has been found in step 1706, control flows to step 1708. At step 1708, a weighting factor is determined based on the current estimated CNR. The weighting factor will be used in step 1710 to produce a replacement waveform by obtaining a weighted combination of the waveform to be replaced and the best-matching waveform segment. In one embodiment, the closer the estimated CNR is to the FFC threshold, the more weight that is given to the waveform to be replaced, and the closer the estimated CNR is to 0 dB, the more weight that is given to the best-matching waveform. For example, assume that $\beta$ is the weighting factor to be applied to the waveform to be replaced and $(1-\beta)$ is the weighting factor to be applied to the best-matching waveform. Then, in an embodiment, the value of $\beta$ may be set to 0 when the estimated CNR is 0 dB, set to 1 when the estimated CNR is greater than or equal to the FFC threshold, and set to a value between 0 and 1 that is obtained through linear interpolation when the estimated CNR is between 0 dB and the FFC threshold.

Once the weighting factor has been obtained during step 1708, it is then used to generate a weighted combination of the waveform to be replaced and the best-matching waveform segment, thereby producing the replacement waveform as shown at step 1710. As noted above, in one embodiment, when the estimated CNR is less than or equal to 0 dB, the replacement waveform will be identical to the best-matching waveform segment, when the estimated CNR is greater than or equal to the FFC threshold, the replacement waveform will be identical to the waveform to be replaced, and when the estimated CNR is between 0 and 4 dB, the replacement waveform will be a linear combination of the best-matching waveform segment and the waveform to be replaced.

The foregoing approach is advantageous in that it mixes at least some of the new content of the original waveform with the replacement waveform in situations where noise has not completely obliterated the original waveform. This can help avoid repeating the same extrapolated waveform over and over during a prolonged period of significant noise, which can result in a very periodic and "buzzy" replacement signal.

At step 1712, the waveform to be replaced is replaced with the replacement waveform obtained during step 1710. In an embodiment such as that shown in FIG. 18, in which fast fading compensation is applied to frames of an audio signal as they are output by IFFT logic block 1808, a sine window must first be applied to the replacement waveform before such replacement can occur. In further embodiments, when the estimated CNR has been below the FFC threshold for longer than a predetermined period of time, soft muting may be used to attenuate the replacement waveform.

Finally, at step 1714, the method of flowchart 1700 ends.

C. Second Example System and Method for Enhancing Audio Quality of an FM Receiver A second main embodiment of a system for enhancing the audio quality of an FM receiver will now be described. As discussed above, the first main embodiment utilizes special hardware in the FM stereo decoder to generate a quadrature-demodulated L–R noise signal that provides a reliable representation of the L–R noise floor. This L–R noise floor is then used to estimate the L+R noise floor and the CNR. However, in the second main embodiment, it is assumed that no special hardware is available to produce the quadrature-demodulated L–R noise. Rather in the second main embodiment, the L+R signal is sampled at a high enough sampling rate to allow the extraction of the stop band signal between 15 and 23 kHz (see FIG. 1). After suppressing the 19 kHz stereo pilot tone and possible further band selection to avoid some spurious tones, the average power of this stop band signal is then combined with table look-up and interpolation along the frequency and CNR axes to estimate the L–R noise floor, L+R noise floor, and CNR based on empirically derived tables. L+R pop suppression, L–R and L+R noise suppression, and L–R and L+R fast fading compensation may then be performed in generally the same manner as described above in reference to the first main embodiment.

Figure 19:
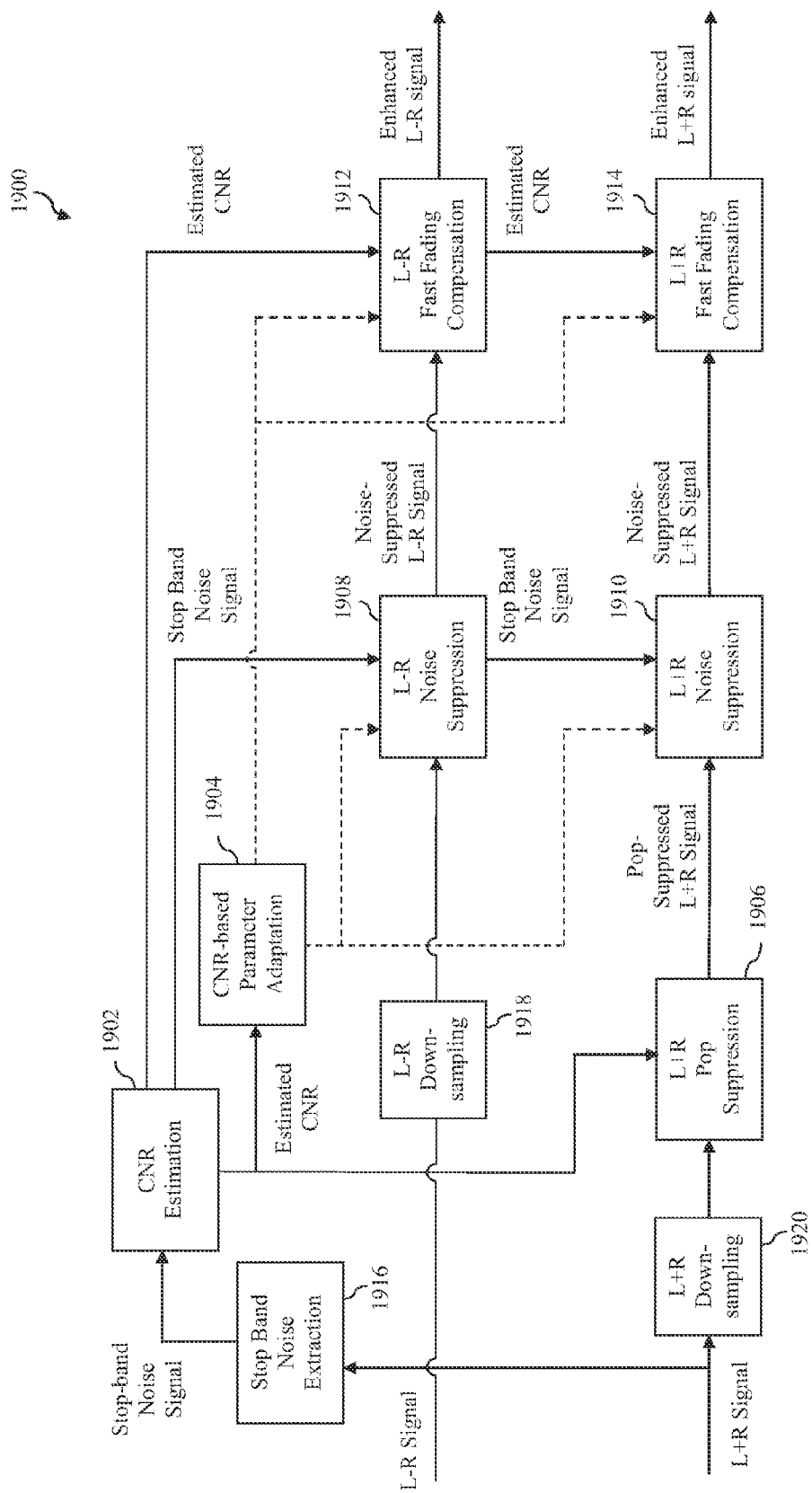
FIG. 19 is a block diagram that shows various components of FM audio enhancement logic in accordance with a second main embodiment.

FIG. 19 is a block diagram that shows various components of FM audio enhancement logic 1900 that may be implemented in an FM receiver in accordance with the second main embodiment. As shown in FIG. 19, FM audio enhancement logic 1900 includes CNR estimation logic 1902, CNR-based parameter adaptation logic 1904, L+R pop suppression logic 1906, L–R noise suppression logic 1908, L+R noise suppression logic 1910, L–R fast fading compensation logic 1912, L+R fast fading compensation logic 1914, stop band noise extraction logic 1916, L–R down-sampling logic 1918, and L+R down-sampling logic 1920. Each of the components of FM audio enhancement logic 1900 may be implemented in hardware, software, or as a combination of hardware or software. In accordance with certain embodiments, one or more of the components of FM audio enhancement logic 1900 are implemented as firmware that is executed by a processing unit, wherein the processing unit may be included within an FM receiver of which FM audio enhancement logic 1900 is a part or may be connected to such an FM receiver.

Figure 20:
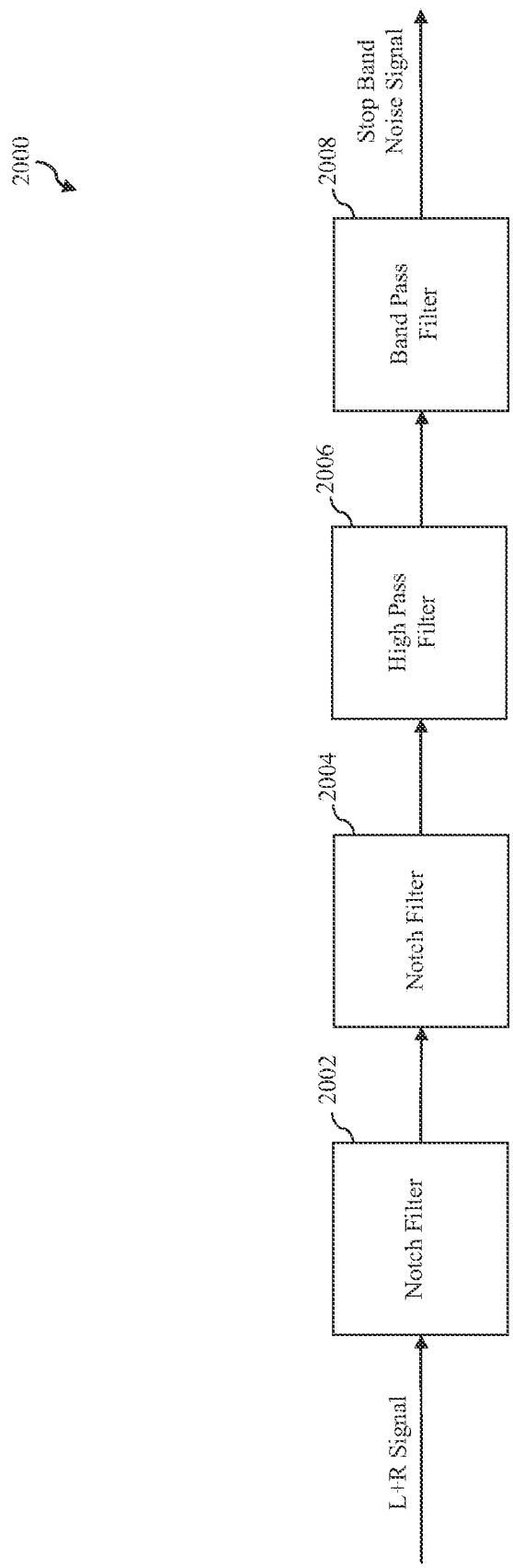
FIG. 20 is a block diagram that shows a cascade of filters that may be applied by stop band noise extraction logic in accordance with an embodiment.

As shown in FIG. 19, stop band noise extraction logic 1916 operates to receive an L+R signal that is provided by an FM stereo decoder. As noted above, the L+R signal is sampled at a sampling rate that is high enough to allow the extraction of the stop band signal between 15 and 23 kHz of the composite baseband signal produced by an FM demodulator. In one embodiment, the L+R signal is sampled at 48 kHz. Stop band noise extraction logic 1916 filters the L+R signal to produce a stop band noise signal. In one embodiment, stop band noise extraction logic 1916 applies a series or cascade of filters to produce the stop band noise signal. For example, as shown in FIG. 20, in one embodiment stop band noise extraction logic 1916 applies a cascade of filters 2000 that includes a first notch filter 2002, a second notch filter 2004, a high-pass filter 2006 and a band-pass filter 2008 to produce the stop band noise signal. Notch filters 2002 and 2004 are each configured to remove the 19 kHz tone from the L+R signal. In one embodiment, each of notch filters 2002 and 2004 comprise the same second-order IR filter. High pass filter 2006 is configured to remove audio energy associated with the active signal band that appears below the 19 kHz pulse. Band pass filter 2008 is configured to pass signal components in the frequency band of 19.4 to 21.4 kHz to remove other spurious tones that may appear in the L+R signal.

The stop-band noise signal produced by stop band noise extraction logic 1916 is passed to each of CNR estimation logic 1902, L–R noise suppression logic 1908 and L+R noise suppression logic 1910.

Figure 21:
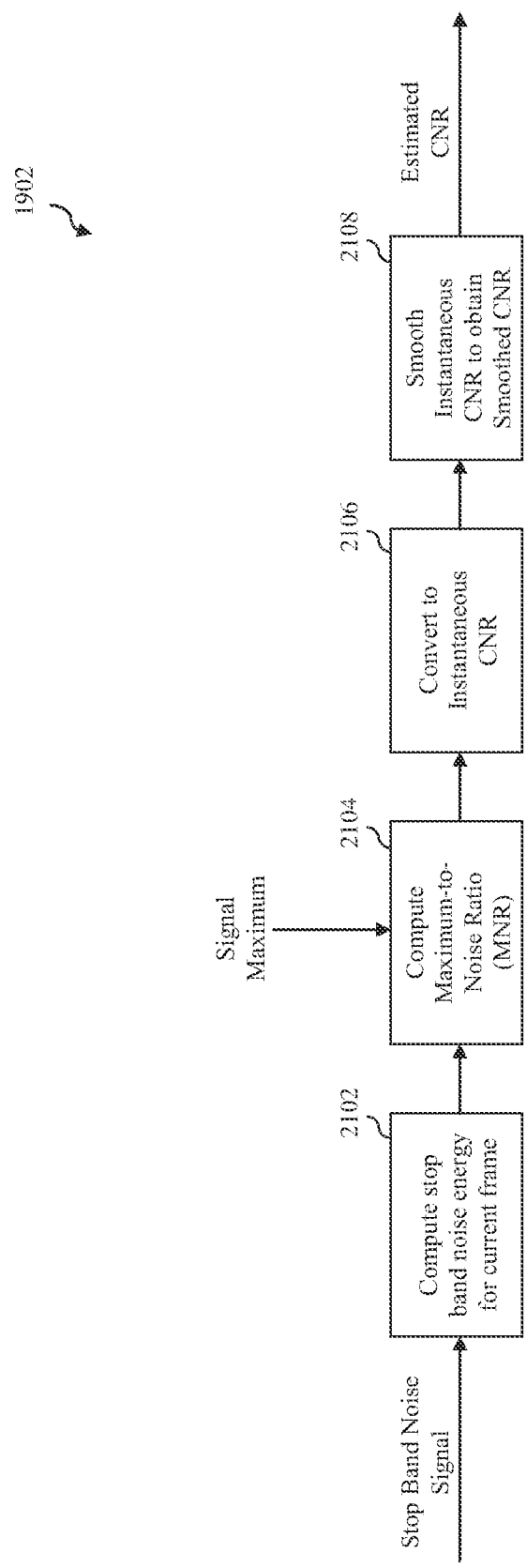
FIG. 21 is a block diagram of an example CNR estimator in accordance with a further embodiment.

CNR estimation logic 1902 uses the stop band noise signal to estimate a CNR for the current L–R and L+R frames. As shown in FIG. 21, in one embodiment, CNR estimation logic 1902 includes a first logic block 2102 that receives the stop band noise signal and uses it to compute a stop band noise energy for a current frame. A second logic block 2104 then computes a ratio between a predetermined maximum signal energy for the stop band signal and the stop band noise energy, thereby yielding a maximum-to-noise ratio (MNR) for the current frame. After the MNR has been computed for the current frame, a third logic block 2106 converts the MNR to an instantaneous CNR for the current frame. In one embodiment, converting the MNR to the instantaneous CNR comprises obtaining a logarithmic value of the MNR and then subtracting a predetermined offset, wherein the predetermined offset comprises the difference between an MNR at which it has been observed that noise pulses appear in the L+R signal and a CNR at which it is expected that noise pulses will appear when there is no audio signal (e.g., 12 dB). Once an instantaneous CNR has been obtained for the current frame, that instantaneous CNR is smoothed by a fourth logic block 2108 to obtain a smoothed CNR for the current frame, which is then output by CNR estimator 1902 as the estimated CNR for the current frame.

L–R noise suppression logic 1908 utilizes the power of the stop band noise signal to estimate the power spectrum of the L–R noise needed to perform L–R noise suppression. Because the power of the stop band noise and the power spectrum of the L–R noise have an observable relationship based both on frequency and CNR, the amount of offset to be applied for a given frequency sub-band and given estimated CNR can be determined empirically and stored in a look-up table which can then be used to perform this step. In one embodiment, the look-up table includes offsets for only a subset of all possible combinations of frequency sub-bands/estimated CNRs and linear interpolation between table entries is used to derive offsets for other combinations.

In a like manner, L+R noise suppression logic 1910 utilizes the power of the stop band noise signal to estimate the power spectrum of the L+R noise needed to perform L+R noise suppression. Because the power of the stop band noise and the power spectrum of the L+R noise have an observable relationship based both on frequency and CNR, the amount of offset to be applied for a given frequency sub-band and given estimated CNR can be determined empirically and stored in a look-up table which can then be used to perform this step. In one embodiment, the look-up table includes offsets for only a subset of all possible combinations of frequency sub-bands/estimated CNRs and linear interpolation between table entries is used to derive offsets for other combinations.

L+R down-sampling logic 1920 is configured to convert the L+R signal having a sampling rate that is high enough to allow the extraction of the stop band signal between 15 and 23 kHz of the composite baseband signal to a lower sampling rate before it is processed by L+R pop suppression logic 1906. In one embodiment, L+R down-sampling logic 1920 is configured to convert the L+R signal from 48 kHz to 32 kHz.

In the embodiment shown in FIG. 19, the L–R signal that is provided from the FM stereo decoder is provided at the same sampling rate as the L+R signal. Accordingly, FM audio enhancement logic 1900 also includes L–R down-sampling logic 1918 that is configured to convert the L–R signal from this sampling rate to a lower sampling rate before it is processed by L–R noise suppression logic 1908. In one embodiment, L–R down-sampling logic 1918 is configured to convert the L–R signal from 48 kHz to 32 kHz.

Except for the differences noted above, each of the other components of FM audio enhancement logic 1900 may operate in essentially the same manner as their like-named counterparts shown in FIG. 3. For example, CNR-based parameter adaption logic 1904 uses an estimated CNR output by CNR estimation logic 1902 to select various parameters that will be used to control the manner in which L–R noise suppression, L+R noise suppression, L–R fast fading compensation and L+R fast fading compensation are performed.

Furthermore, L+R pop suppression logic 1906 will perform pop suppression on the down-sampled L+R signal to produce a pop-suppressed L+R signal when the estimated CNR received from CNR estimation logic 1902 drops below a predefined threshold. Otherwise, L+R pop suppression logic 1902 will output an unmodified version of the down-sampled L+R signal as the pop-suppressed L+R signal.

Figure 22:
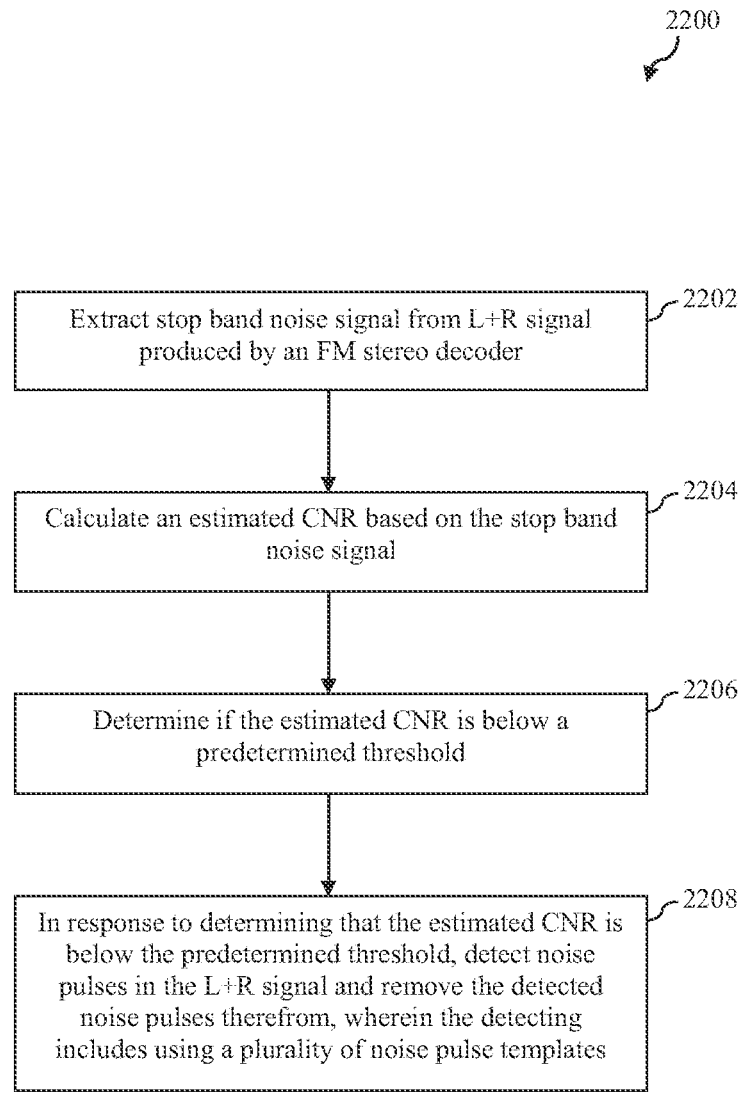
FIG. 22 depicts a high-level flowchart of a manner in which L+R pop suppression is performed in accordance with a second main embodiment.

FIG. 22 depicts a high-level flowchart 2200 of the manner in which L+R pop suppression is performed in accordance with an embodiment. The method of flowchart 2200 may be performed, for example, by the components of FM audio enhancement logic 1900 as described above in reference to FIG. 19. However, the method is not limited to that implementation.

As shown in FIG. 22, the method of flowchart 2200 begins at step 2202 in which a stop band noise signal is extracted from an L+R signal that is produced by an FM stereo decoder. By way of example, this step may be performed by stop band noise extraction logic 1916 as described above in reference to FIG. 19. At step 2204, an estimated CNR is calculated based on the stop band noise signal. By way of example, this step may be performed by CNR estimation logic 1902 as described above in reference to FIG. 19. At step 2206, it is determined if the estimated CNR is below a predetermined threshold. At step 2208, in response to determining that the estimated CNR is below the predetermined threshold, noise pulses are detected in the L+R signal and the detected noise pulses are removed therefrom, wherein the detecting of noise pulses includes using a plurality of noise pulse templates. By way of example, steps 2206 and 2208 may performed by L+R pop suppression logic 1906 as described above in reference to FIG. 19.

L–R noise suppression logic 1908 is configured to receive the down-sampled L–R signal and apply single-channel noise suppression thereto in the frequency domain in order to produce a noise-suppressed L–R signal. In a similar manner, L+R noise suppression logic 1908 is configured to receive the pop-suppressed L+R signal from L+R pop suppression logic 1906 and apply single-channel noise suppression thereto in the frequency domain in order to produce a noise-suppressed L+R signal.

Figure 23:
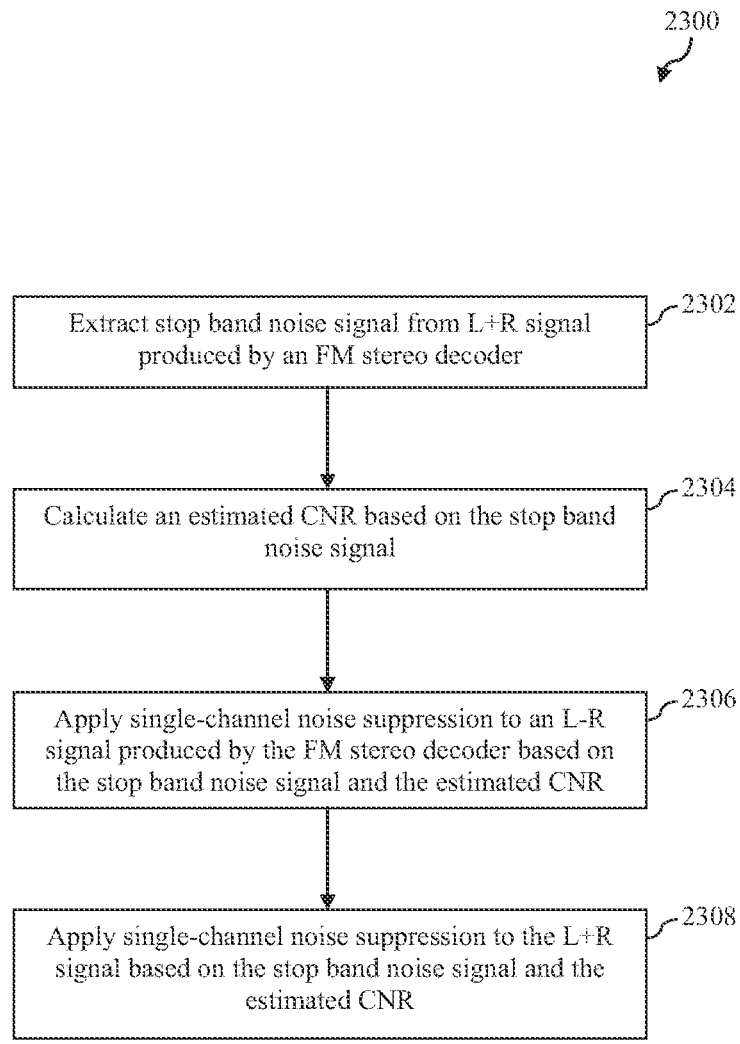
FIG. 23 depicts a high-level flowchart of a manner in which L−R and L+R noise suppression are performed in accordance with a second main embodiment.

FIG. 23 depicts a high-level flowchart 2300 of a manner in which L−R and L+R noise suppression are performed in accordance with an embodiment. The method of flowchart 2300 may be performed, for example, by the components of FM audio enhancement logic 1900 as described above in reference to FIG. 19. However, the method is not limited to that implementation.

As shown in FIG. 23, the method of flowchart 2300 begins at step 2302 in which a stop band noise signal is extracted from an L+R signal that is produced by an FM stereo decoder. By way of example, this step may be performed by stop band noise extraction logic 1916 as described above in reference to FIG. 19. At step 2304, an estimated CNR is calculated based on the stop band noise signal. By way of example, this step may be performed by CNR estimation logic 1902 as described above in reference to FIG. 19. At step 2306, single-channel noise suppression is applied to an L−R signal that is produced by the FM stereo decoder based on the stop band noise signal and the estimated CNR. By way of example, this step may be performed by L−R noise suppression logic 1908 as described above in reference to FIG. 19. At step 2308, single-channel noise suppression is applied to the L+R signal based on the stop band noise signal and the estimated CNR. By way of example, this step may be performed by L+R noise suppression logic 1910 as described above in reference to FIG. 19.

Figure 24:
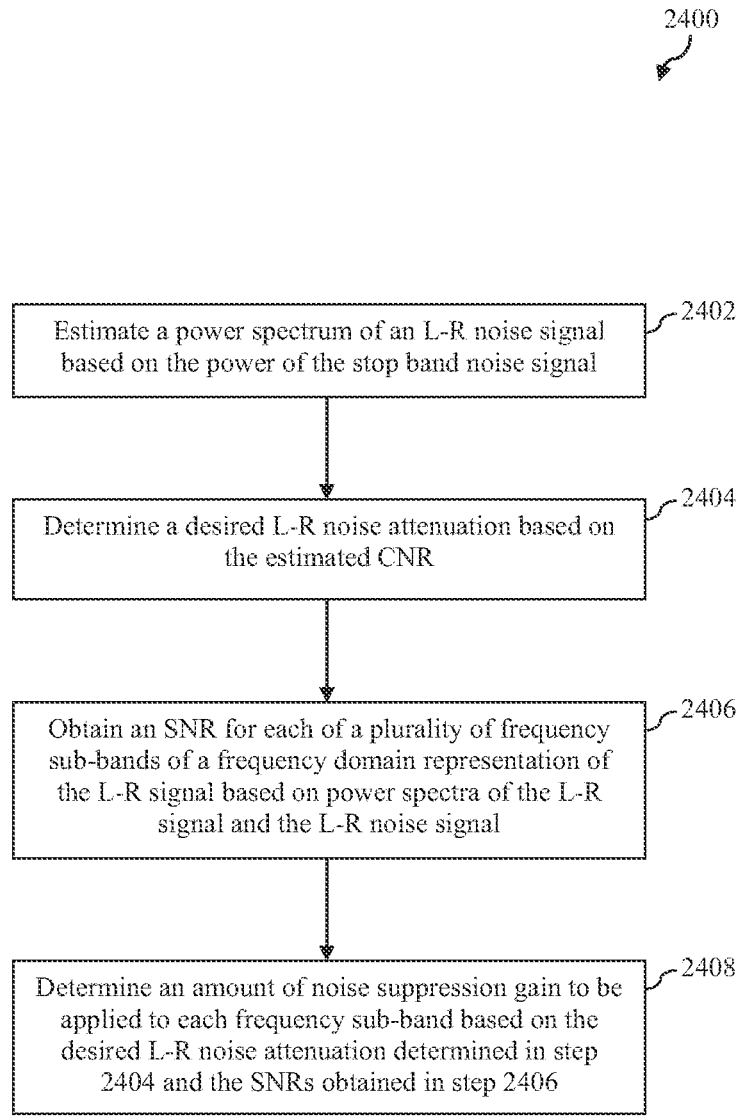
FIG. 24 depicts a high-level flowchart of a manner in which single-channel L−R noise suppression is performed in accordance with a second main embodiment.

FIG. 24 depicts a high-level flowchart 2400 of a manner in which step 2306 of flowchart 2300 may be performed in accordance with an embodiment. As shown in FIG. 24, the method of flowchart 2400 begins at step 2402 in which a power spectrum of the L−R noise signal is estimated based on the power of the stop band noise signal. At step 2404, a desired L−R noise attenuation is obtained based on the estimated CNR. At step 2406, an SNR is obtained for each of a plurality of frequency sub-bands of a frequency domain representation of the L−R signal based on the power spectra of the L−R signal and the L−R noise signal. At step 2408, an amount of noise suppression gain to be applied to each frequency sub-band of the frequency domain representation of the L−R signal is determined based on the desired L−R noise attenuation determined in step 2404 and the SNRs obtained in step 2406.

Figure 25:
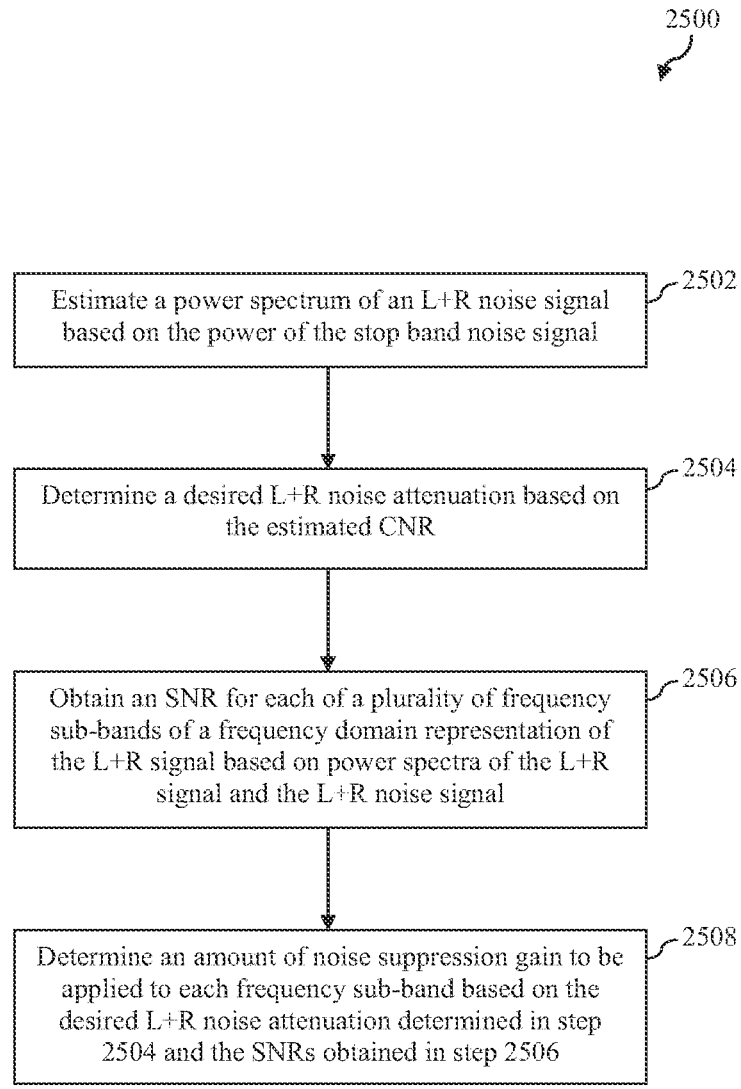
FIG. 25 depicts a high-level flowchart of a manner in which single-channel L+R noise suppression is performed in accordance with a second main embodiment.

FIG. 25 depicts a high-level flowchart 2500 of a manner in which step 2308 of flowchart 2300 may be performed in accordance with an embodiment. As shown in FIG. 25, the method of flowchart 2500 begins at step 2502 in which a power spectrum of an L+R noise signal is estimated based on the power of the stop band noise signal. At step 2504, a desired L+R noise attenuation is determined based on the estimated CNR. At step 2506, an SNR is obtained for each of a plurality of frequency sub-bands of a frequency domain representation of the L+R signal based on the power spectra of the L+R signal and the L+R noise signal. At step 2508, an amount of noise suppression gain to be applied to each frequency sub-band of the frequency domain representation of the L+R signal is determined based on the desired L+R noise attenuation determined in step 2504 and the SNRs obtained in step 2506.

L−R fast fading compensation logic 1912 is configured to receive the noise-suppressed L−R signal produced by L−R noise suppression logic 1908 and apply fast fading compensation thereto in order to produce an enhanced L−R signal. In a similar manner, L+R fast fading compensation logic 1914 is configured to receive the noise-suppressed L+R signal produced by L+R noise suppression logic 1910 and apply fast fading compensation thereto in order to produce an enhanced L+R signal. As discussed above, fast fading compensation involves utilizing a novel form of waveform extrapolation to replace noisy segments of the L−R and L+R signals at very low CNRs.

Figure 26:
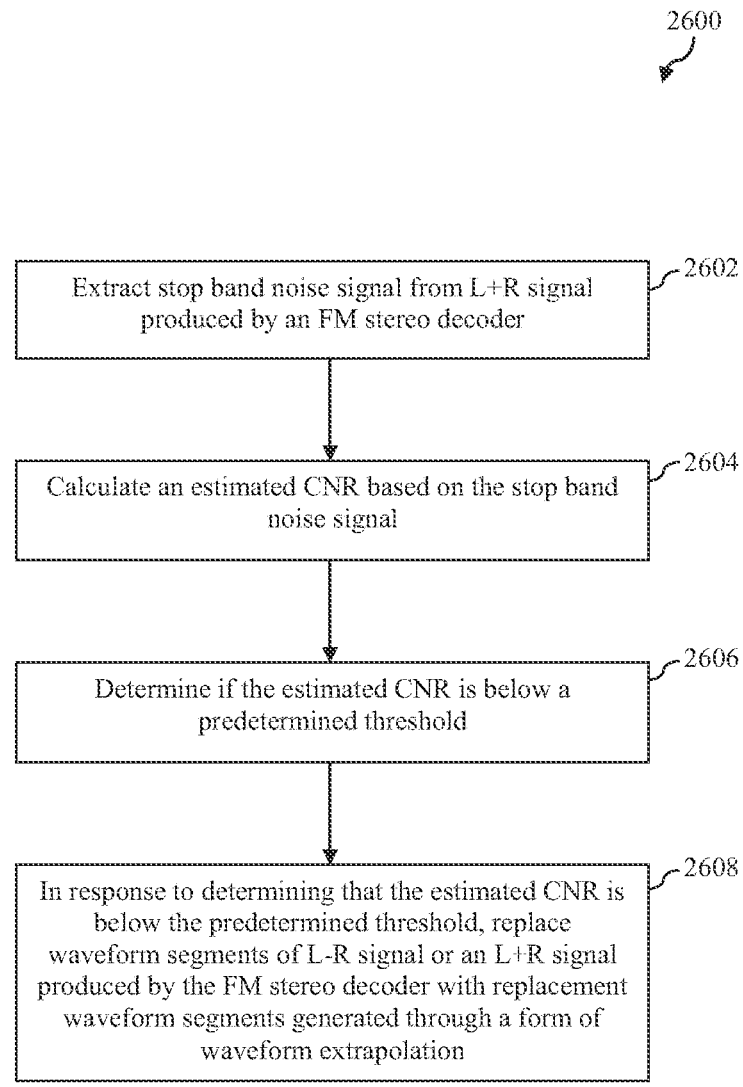
FIG. 26 depicts a high-level flowchart of a manner in which L−R and L+R fast fading compensation are performed in accordance with a second main embodiment.

FIG. 26 depicts a high-level flowchart 2600 of the manner in which L−R and L+R fast fading compensation are performed in accordance with an embodiment. The method of flowchart 2600 may be performed, for example, by the components of FM audio enhancement logic 1900 as described above in reference to FIG. 19. However, the method is not limited to that implementation.

As shown in FIG. 26, the method of flowchart 2600 begins at step 2602 in which a stop band noise signal is extracted from an L+R signal produced by an FM stereo decoder. By way of example, this step may be performed by stop band noise extraction logic 1916 as described above in reference to FIG. 19. At step 2604, an estimated CNR is calculated based on the stop band noise signal. By way of example, this step may be performed by CNR estimation logic 1902 as described above in reference to FIG. 19. At step 2606, it is determined if the estimated CNR is below a predetermined threshold. At step 2608, in response to determining that the estimated CNR is below the predetermined threshold, waveform segments of an L−R signal produced by the FM stereo decoder or the L+R signal are replaced with replacement waveform segments generated through a form of waveform extrapolation. By way of example, steps 2606 and 2608 may performed by either of L−R fast fading compensation logic 1912 or L+R fast fading compensation logic 1914 as described above in reference to FIG. 19.

The enhanced L−R signal and enhanced L+R signal produced by FM audio enhancement logic 1900 may subsequently be combined in a well-known manner by an FM receiver to produce L and R channels of audio output.

Although the foregoing description of the second main embodiment refers to extracting a stop band noise signal from an L+R signal produced by an FM stereo decoder, persons skilled in the relevant art(s) will appreciate that the stop band noise signal may also be extracted from an L−R signal produced by an FM stereo decoder. Accordingly, in an alternate embodiment, stop band noise extraction logic 1916 operates to extract the stop band noise signal from an L−R signal generated by an FM stereo decoder rather than from an L+R signal generated by the FM stereo decoder.

D. Conclusion

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims.

For example, the present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

As another example, various embodiments described herein calculate an estimated CNR based an L−R noise signal or a stop band noise signal and then use the estimated CNR to control the performance of one or more processes. However, it is noted that a variety of FM channel quality measures (referred to elsewhere herein for the sake of brevity as "channel quality measures") other than an estimated CNR may be calculated based on the L−R noise signal or the stop band noise signal and used to control the performance of such processes. For example, an SNR or any other channel quality measure may also be used.

Furthermore, in the description provided above, pop suppression is said to be performed on an L+R signal, noise suppression is said to be performed on an L−R signal and on a pop-suppressed L+R signal, and fast fading compensation is said to be performed on a noise-suppressed L−R signal and a noise-suppressed L+R signal. However, it is to be understood that any of the foregoing processes can each be performed directly on the L+R and L−R signals produced by the FM stereo decoder or upon a processed version of such L+R or L−R signals. Thus, in the appended claims, any reference to an L+R signal is intended to broadly represent an L+R signal produced by an FM stereo decoder as well as any processed version of such L+R signal and any reference to an L−R signal is intended to broadly represent an L−R signal produced by an FM stereo decoder as well as any processed version of such L−R signal. Additionally, it is possible that any of the signal processing techniques described herein as being performed on an L+R signal and/or an L−R signal may also be performed on an L signal obtained by adding the L+R signal and L−R signal and/or on an R signal obtained by subtracting the L−R signal from the L+R signal.

What is claimed is:

1. A method for enhancing the audio quality of a Frequency Modulation (FM) receiver, comprising:
    receiving a composite baseband signal that is output from an FM demodulator, the FM demodulator demodulating an input signal to produce the composite baseband signal;
    applying quadrature L−R demodulation to the received composite baseband signal to obtain an L−R noise signal, wherein applying the quadrature L−R demodulation to the composite baseband signal comprises demodulating the composite baseband signal with a carrier that is orthogonally out of phase with a pilot tone included in the composite baseband signal;
    calculating a channel quality measure based on the L−R noise signal; and
    determining whether to perform a process that includes detecting noise pulses in an L+R signal that is obtained from the composite baseband signal and removing the detected noise pulses therefrom based on the channel quality measure.

2. The method of claim 1, wherein the detecting includes using a plurality of noise pulse templates.

3. The method of claim 2, wherein using the plurality of noise pulse templates comprises using a plurality of noise pulse templates each of which is obtained by sub-sampling a single noise pulse at different phases.

4. The method of claim 2, wherein using the plurality of noise pulse templates comprises using one or more noise pulse templates that represent multiple overlapping noise pulses.

5. The method of claim 1, wherein calculating the channel quality measure comprises calculating an estimated carrier-to-noise ratio.

6. The method of claim 2, wherein the detecting comprises:
    calculating a prediction error by at least processing the L+R signal in a short-term prediction error filter;
    convolving each noise pulse template with an impulse response of the short-term prediction error filter to obtain a plurality of convolved noise pulse templates; and
    comparing the convolved noise templates with comparison waveforms derived from the prediction error to identify the location of candidate noise pulses in the L+R signal.

7. The method of claim 6, wherein processing the L+R signal in the short-term prediction error filter comprises:
    processing the L+R signal in a short-term prediction error filter that includes a short-term predictor that predicts the value of a current sample as the weighted sum of a number of prior samples, wherein the prior samples are not adjacent to each other or to the current sample.

8. The method of claim 6, wherein calculating the prediction error further comprises:
    processing a short-term prediction error produced by the short-term prediction error filter in a long-term prediction error filter to produce a long-term prediction error.

9. The method of claim 6, wherein comparing the convolved noise templates with comparison waveforms derived from the prediction error comprises performing the following for each of a predetermined number of samples of the prediction error:
    generating a comparison waveform corresponding to the sample;
    comparing the generated comparison waveform with each convolved noise pulse template to determine a measure of dissimilarity or a measure of similarity associated with each convolved noise pulse;
    identifying the convolved noise pulse template that provides the smallest measure of dissimilarity or the greatest measure of similarity; and
    identifying the location of a candidate noise pulse in the L+R signal based on the sample if the smallest measure of dissimilarity is less than a predefined dissimilarity threshold or if the greatest measure of dissimilarity is greater than a predefined similarity threshold.

10. The method of claim 9, wherein generating the comparison waveform for a particular sample in the prediction error comprises:
    identifying a prediction error waveform that comprises a fixed number of samples that precede the particular sample, the particular sample, and a fixed number of samples that follow the particular sample; and
    normalizing and applying an offset to each of the samples of the prediction error waveform.

11. The method of claim 6, further comprising:
    confirming that a candidate noise pulse in the L+R signal is a noise pulse; and
    subtracting a scaled version of a noise pulse template corresponding to the candidate noise pulse from the L+R signal in response to confirming that the candidate noise pulse is a noise pulse.

12. The method of claim 11, wherein confirming that the candidate noise pulse in the L+R signal is a noise pulse comprises at least determining a measure of dissimilarity or a measure of similarity between the candidate noise pulse and a plurality of sub-vectors derived from each noise pulse template.

13. The method of claim 11, further comprising:
subtracting a convolved version of a noise pulse template corresponding to the candidate noise pulse from the prediction error in response to confirming that the candidate noise pulse is a noise pulse.

14. The method of claim 11, further comprising:
searching for a noise pulse in the L+R signal at a location that is a predefined number of samples prior to the candidate noise pulse in response to confirming that the candidate noise pulse is a noise pulse.

15. A method for enhancing the audio quality of a Frequency Modulation (FM) receiver, comprising:
receiving a composite baseband signal that is output from an FM demodulator, the FM demodulator demodulating an input signal to produce the composite baseband signal;
applying quadrature L−R demodulation to the received composite baseband signal to obtain an L−R noise signal, wherein applying the quadrature L−R demodulation to the composite baseband signal comprises demodulating the composite baseband signal with a carrier that is orthogonally out of phase with a pilot tone included in the composite baseband signal; and
applying single-channel noise suppression to an L−R signal that is obtained from the composite baseband signal in a manner that is based on the L−R noise signal.

16. The method of claim 15, further comprising calculating a channel quality measure based on the L−R noise signal;
wherein applying the single-channel noise suppression to the L−R signal comprises:
determining a desired L−R noise attenuation based on the channel quality measure; and
determining an amount of noise suppression gain to be applied to each of a plurality of frequency sub-bands of a frequency domain representation of the L−R signal based at least on the desired L−R noise attenuation.

17. The method of claim 16, wherein calculating the channel quality measure comprises calculating an estimated carrier-to-noise ratio.

18. The method of claim 16, wherein applying the single-channel noise suppression to the L−R signal further comprises obtaining a signal to noise ratio (SNR) for each of the plurality of frequency sub-bands of the frequency domain representation of the L−R signal based on power spectra of the L−R signal and the L−R noise signal; and
wherein determining the amount of noise suppression gain to be applied to each of the plurality of frequency sub-bands of the frequency domain representation of the L−R signal is performed based on the desired L−R noise attenuation and the SNR obtained for each of the plurality of frequency sub-bands of the frequency domain representation of the L−R signal.

19. The method of claim 18, further comprising:
identifying a main signal band of the frequency domain representation of the L−R signal based on the SNRs obtained for the plurality of frequency sub-bands of the frequency domain representation of the L−R signal; and
determining an amount of additional attenuation to be applied to frequency sub-bands of the frequency domain representation of the L−R signal that are determined not to be within the main signal band.

20. The method of claim 16, further comprising:
determining that additional attenuation is to be applied to all of the frequency sub-bands of the frequency domain representation of the L−R signal in response to determining that the channel quality measure is below a predefined threshold.

21. The method of claim 16, further comprising:
determining that additional attenuation is to be applied to a predetermined number of the highest-frequency sub-bands of the frequency domain representation of the L−R signal in response to determining that the channel quality measure is below a predefined threshold.

22. The method of claim 15, further comprising:
applying single-channel noise suppression to an L+R signal that is obtained from the composite baseband signal in a manner that is based on the L−R noise signal.

23. The method of claim 22, further comprising calculating a channel quality measure based on the L−R noise signal;
wherein applying the single-channel noise suppression to the L+R signal comprises:
determining a desired L+R noise attenuation based on the channel quality measure; and
determining an amount of noise suppression gain to be applied to each of a plurality of frequency sub-bands of a frequency domain representation of the L+R signal based at least on the desired L+R noise attenuation.

24. The method of claim 23, wherein applying the single-channel noise suppression to the L+R signal further comprises:
estimating a power spectrum of an L+R noise signal based on the power spectrum of the L−R noise signal; and
obtaining a signal to noise ratio (SNR) for each of the plurality of frequency sub-bands of the frequency domain representation of the L+R signal based on a power spectrum of the L+R signal and the power spectrum of the L+R noise signal; and
wherein determining the amount of noise suppression gain to be applied to each of the plurality of frequency sub-bands of the frequency domain representation of the L+R signal is performed based on the desired L+R noise attenuation and the SNR obtained for each of the plurality of frequency sub-bands of the frequency domain representation of the L+R signal.

25. The method of claim 24, further comprising:
identifying a main signal band of the frequency domain representation of the L+R signal based on the SNRs obtained for the plurality of frequency sub-bands of the frequency domain representation of the L+R signal; and
determining an amount of additional attenuation to be applied to frequency sub-bands of the frequency domain representation of the L+R signal that are determined not to be within the main signal band.

26. The method of claim 23, further comprising:
determining that additional attenuation is to be applied to all of the frequency sub-bands of the frequency domain representation of the L+R signal in response to determining that the channel quality measure is below a predefined threshold.

27. The method of claim 23, further comprising:
determining that additional attenuation is to be applied to a predetermined number of the highest-frequency sub-bands of the frequency domain representation of the L+R signal in response to determining that the channel quality measure is below a predefined threshold.

28. A method for enhancing the audio quality of a Frequency Modulation (FM) receiver, comprising:

receiving a composite baseband signal that is output from an FM demodulator, the FM demodulator demodulating an input signal to produce the composite baseband signal;

applying quadrature L−R demodulation to the received composite baseband signal to obtain an L−R noise signal, wherein applying the quadrature L−R demodulation to the composite baseband signal comprises demodulating the composite baseband signal with a carrier that is orthogonally out of phase with a pilot tone included in the composite baseband signal;

calculating a channel quality measure based on the L−R noise signal;

determining whether to perform a process that includes replacing waveform segments of an L−R signal or an L+R signal that is obtained from the composite baseband signal with replacement waveform segments generated through a form of waveform extrapolation based on the channel quality measure.

29. The method of claim 26, wherein calculating the channel quality measure comprises calculating an estimated carrier-to-noise ratio.

30. The method of claim 26, wherein replacing waveform segments of the L−R signal or the L+R signal comprises:
  obtaining a waveform to be replaced from the L−R signal;
  comparing the waveform to be replaced with waveform segments of a previously-received L−R signal to identify a best-matching waveform segment;
  determining a weighting factor based on the channel quality measure;
  obtaining a weighted combination of the waveform to be replaced and the best-matching waveform segment to produce a replacement waveform; and
  replacing the waveform to be replaced with the replacement waveform.

31. The method of claim 30, wherein comparing the waveform to be replaced with waveform segments of a previously-received L−R signal to identify a best-matching waveform segment comprises:
  calculating a measure of similarity or a measure of dissimilarity between the waveform to be replaced and each of the waveform segments of the previously-received L−R signal.

32. The method of claim 28, wherein replacing waveform segments of the L−R signal or the L+R signal comprises:
  obtaining a waveform to be replaced from the L+R signal;
  comparing the waveform to be replaced with waveform segments of a previously-received L+R signal to identify a best-matching waveform segment;
  determining a weighting factor based on the channel quality measure;
  obtaining a weighted combination of the waveform to be replaced and the best-matching waveform segment to produce a replacement waveform; and
  replacing the waveform to be replaced with the replacement waveform.

33. The method of claim 32, wherein comparing the waveform to be replaced with waveform segments of a previously-received L+R signal to identify a best-matching waveform segment comprises:
  calculating a measure of similarity or a measure of dissimilarity between the waveform to be replaced and each of the waveform segments of the previously-received L+R signal.

* * * * *